(12) United States Patent
Kikuda et al.

(10) Patent No.: US 6,301,169 B1
(45) Date of Patent: Oct. 9, 2001

(54) SEMICONDUCTOR MEMORY DEVICE WITH IO COMPRESSION TEST MODE

(75) Inventors: Shigeru Kikuda; Takeshi Hamamoto; Mikio Asakura, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/658,011

(22) Filed: Sep. 8, 2000

(30) Foreign Application Priority Data

Sep. 14, 1999 (JP) ................................. 11-259983

(51) Int. Cl.$^7$ ....................................... G11C 7/00
(52) U.S. Cl. ...................... 365/201; 365/63; 365/189.02
(58) Field of Search ...................... 365/201, 63, 189.02, 365/230.02

(56) References Cited

U.S. PATENT DOCUMENTS

| | | | |
|---|---|---|---|
| 5,208,778 | 5/1993 | Kumanoya et al. | 365/201 |
| 5,367,492 * | 11/1994 | Kawamoto et al. | 365/201 |
| 5,818,792 * | 10/1998 | Sasaki et al. | 365/230.08 |
| 5,920,573 * | 7/1999 | Dorney | 365/201 |

FOREIGN PATENT DOCUMENTS

| | | |
|---|---|---|
| 9-63297 | 3/1997 | (JP). |
| 11-16391 | 1/1999 | (JP). |

* cited by examiner

Primary Examiner—Son T. Dinh
(74) Attorney, Agent, or Firm—McDermott, Will & Emery

(57) ABSTRACT

In a set of memory cells selected by one column select line, a memory cell of at least 1 bit is connected to an internal data line that is different from the internal data line to which another memory cell in the same set is connected. An internal data line pair is connected to a data terminal. Thus, data having different logic levels can be written into adjacent memory cells even in an IO compression test mode.

10 Claims, 15 Drawing Sheets

| DB | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| DQ ×16 | 0 | 1 | 2 | 3 | 4 | 5 | 6 | 7 | 8 | 9 | 10 | 11 | 12 | 13 | 14 | 15 |
| ×8 | 0 | | 1 | | 2 | | 3 | | 4 | | 5 | | 6 | | 7 | |
| ×4 | | | 0 | | | | 1 | | | | 2 | | | | 3 | |

F I G. 6A
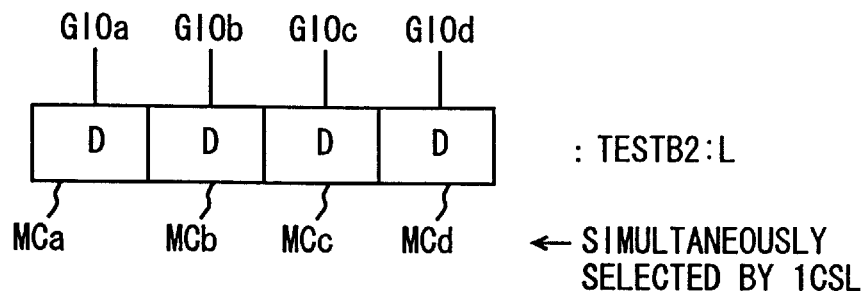
F I G. 6B
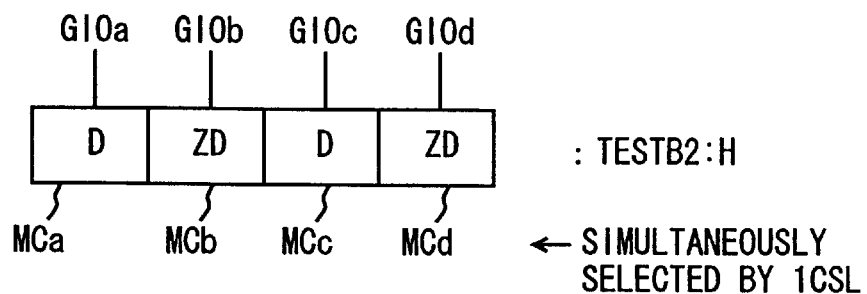
F I G. 7
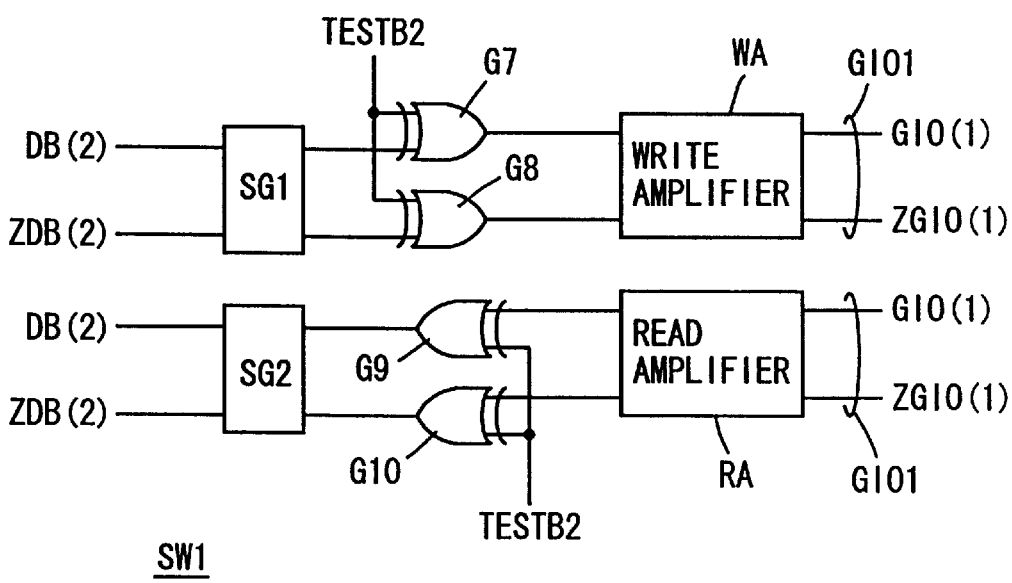

SEMICONDUCTOR MEMORY DEVICE WITH IO COMPRESSION TEST MODE

BACKGROUND OF THE INVENTION

1. Field of the Invention

The present invention relates to semiconductor memory devices, and more particularly, to a semiconductor memory device having an IO compression test mode.

2. Description of the Background Art

FIG. 15 is a diagram schematically showing an entire configuration of a conventional semiconductor memory device. The semiconductor memory device MD in FIG. 15 includes: memory arrays MA0–MA3 respectively disposed for quartered regions of a chip; and row decoders RD0–RD3 provided corresponding to respective memory arrays MA0–MA3 for driving addressed rows in corresponding memory arrays MA0–MA3 to a selected state. Each of memory arrays MA0–MA3 has a storage capacity, for example, of 16M bits, and semiconductor memory device MD has a storage capacity of 64M bits, for example.

Column related circuit blocks CP0–CP3 are provided corresponding to memory arrays MA0–MA3, respectively. Each of column related circuit blocks CP0–CP3 includes: a column decoder selecting an addressed column, a preamplifier for amplifying data in a memory cell selected by the column decoder; and a write driver for writing data to the memory cell selected by the column decoder.

In a central region between memory arrays MA0, MA2 and memory arrays MA1, MA3, an internal data bus DBB is disposed common to memory arrays MA0–MA3. Internal data bus DBB has a bus width, for example, of 16 bits, and a prescribed number of data lines are used according to the pin arrangement (e.g., ×4, ×8 and ×16) of semiconductor memory device MED.

In the central region between memory arrays MA0 and MA1, a peripheral pad group PPG is disposed to receive an address signal and a control signal. In the central region between memory arrays MA2 and MA3, a DQ pad group DPG is disposed for sending and receiving data to and from internal data bus DBB. Peripheral pad group PPG and DQ pad group DPG include buffering circuits provided corresponding to the pads.

In this semiconductor memory device MD, one memory array is selected in operation for data access. This is because semiconductor memory device MD takes a bank configuration, and each of memory arrays MA0–MA3 can be utilized as a bank.

FIG. 16 is a diagram schematically showing a configuration of memory array MAi (i=0–3). Memory array MAi in FIG. 16 is divided into memory cell blocks MB00–MBmn arranged in rows and columns. Memory cell blocks MB00–MBmn each have, for example, a storage capacity of 128K bits, and they are placed in eight rows and eight columns.

A sub word driver is disposed between memory cell blocks aligned in a row direction, for driving a word line of a corresponding memory cell block to a selected state. Sub word driver bands SWD1–SWDn having the sub word drivers disposed therein extend within the memory array in a column direction. Sub word driver bands SWD0 and SWDn+1 are placed outside the memory cell blocks.

In memory array MA, a hierarchical word line configuration is utilized. More specifically, a main word line is placed commonly to memory cell blocks aligned in a row direction. In the memory cell blocks, sub word lines are placed corresponding to respective rows of memory cells. Memory cells in each row in the memory cell block are connected to a corresponding sub word line. A sub word driver included in a sub word driver band drives a corresponding sub word line to a selected state according to a signal on the main word line and a predecode signal from a row decoder. This predecode signal is utilized for selecting one of a plurality of sub word lines provided corresponding to a single main word line.

Sense amplifier bands SAB1–SABm are placed between the memory cell blocks aligned in a column direction, and sense amplifier bands SAB0 and SABm+1 are placed at both sides of the memory array. Each of sense amplifier bands SAB0–SABm+1 includes: a sense amplifier circuit for sensing, amplifying and latching data of a memory cell in a corresponding column of memory cell blocks; an IO gate (column select gate) for connecting a corresponding column to an internal data transmission line according to a column select signal from the column decoder; and a bit line precharge/equalize circuit for precharging/equalizing a bit line. Each of sense amplifier bands SAB1–SABm is shared by memory cell blocks adjacent to each other in the column direction.

In memory array MA, memory cells of 16 bits are selected at one time, and the memory cells of 16 bits are coupled to corresponding preamplifier + write driver blocks via the internal data transmission lines (not shown).

FIG. 17 is a diagram schematically showing an arrangement of internal data transmission lines in the memory array shown in FIG. 16. In FIG. 17, memory cell blocks MB40–MB77 arranged in four rows and eight columns are shown. Such an array configuration as shown in FIG. 17 is disposed repeatedly in both row and column directions.

In each of sense amplifier bands SAB4–SAB8, local IO line pairs LIOP are disposed, each pair being placed corresponding to a prescribed number of memory cell blocks. In the arrangement shown in FIG. 17, in each of sense amplifier bands SAB4–SAB8, two local IO line pairs LIOP are disposed for four memory cell blocks adjacent to each other in the row direction. Each of memory cell blocks MB40–MB77 simultaneously sends and receives data to and from the local IO line pairs included in the sense amplifier bands at both sides thereof in the column direction. In the memory cell blocks along which local IO line pairs LIOP extend, memory cells of 4 bits are selected at a time.

For sub wofrd driver bands SWD0–SWD8, global IO line pairs GIOP0–GIOP7 are disposed in every other sub word driver bands SWD1, SWD3, SWD5 and SWD7 in a unit of two global IO line pairs. Local IO line pair LIOP and global IO line pair GIOP (GIOP0–GIOP7) are coupled to each other via a block select gate BSG. Block select gate BSG is driven to a selected state when memory cell blocks aligned in a row direction are selected, and couples corresponding local IO line pair LIOP and global IO line pair GIOP.

A column decoder CD is provided common to the memory cell blocks. Column decoder CD drives one column select line for four memory cell blocks adjacent to each other in the row direction, to a selected state according to a column address signal. This column select line can select memory cells of 4 bits simultaneously. Column decoder CD drives two column select lines to a selected state, and thus, memory cells of 8 bits in total are coupled to global IO line pairs GIOP0–GIOP7.

Global IO line pairs GIOP0–GIOP7 are coupled to a preamplifier + write driver block PW. In this preamplifier + write driver block PW, two global IO line pairs out of 8 bits of global IO line pairs GIOP0–GIOP7 are coupled to internal data bus DBB. In the case of a ×4-bit configuration, this internal data bus DBB also sends and receives data of 2 bits to and fifom another preamplifier + write driver block not shown, provided for other memory blocks.

FIG. 18 is a diagram schematically showing a configuration of a portion related to one memory cell block shown in FIG. 17. Referring to FIG. 18, in each memory cell block, memory cells MC's are arranged in rows and columns, and a sub word line WL is disposed corresponding to each row of the memory cells. In FIG. 18, sub word lines WL (m–7)–WL (m+6) are shown representatively. A bit line pair is placed corresponding to each column of the memory cells. In FIG. 18, bit line pairs BL (n–1), ZBL (n–1)–WL (n+3), ZBL (n+3) are shown representatively. In the memory cell block, memory cells of 2 bits are coupled to the same bit line via one contact hole. Memory cells MC's aligned in the row direction are coupled either to a true bit line BL or to a complementary bit line ZBL.

Column select gates CSG's are placed alternately at both opposite sides of the memory cell block. Column select gates CSG (n–1)–CSG (n+3) include sense amplifier circuits, which in turn are disposed alternately for bit line pairs BLP's. Column select gates CSG (n)–CSG (n+3) are selected according to a column select signal on column select line CSL (1) to couple corresponding bit line pairs to local IO line pairs.

In FIG. 18, bit line pair BL (n) and ZBL (n) are connected to local IO lines LIO (0) and ZLIO (0), respectively, via column select gate CSG (n). Bit lines BL (n+2) and ZBL (n+2) are connected to local IO lines LIO (2) and ZLIO (2), respectively, via column select gate CSG (n+2). Bit lines BL (n+1) and ZBL (n+1) are connected to local IO lines LIO (1) and ZLIO (1), respectively, via column select gate CSG (n+1). Bit lines BL (n+3) and ZBL (n+3) are connected to local IO lines LIO (3) and ZLIO (3), respectively, via column select gate CSG (n+3). In local IO lines LIO (0)–LIO (3) and ZLIO (0)–ZLIO (3), one of paired local IO lines is placed between local IO lines another pair, because of the following reasons. If a pair of local IO lines LIO and ZLIO are disposed adjacent to each other, it would result in a stringent pitch condition for placing transfer gates included in the column select gates. To alleviate this pitch condition, adjacent local IO lines are connected to bit lines in different columns.

Local IO lines LIO (0) and ZLIO (0) are connected to global IO lines GIO (0) and ZGIO (0) via a block select gate BSG. Global IO lines GIO (1) and ZGIO (1) are connected via block select gate BSG to local IO lines LIO (1) and ZLIO (1), which in turn are placed, in the diagram, at the lower side of the memory cell block.

Local IO lines LIO (2) and ZLIO (2) are connected via block select gate BSG respectively to global IO lines GIO (2) and ZGIO (2), which in turn are placed at the right side in the diagram. Local IO lines LIO (3) and ZLIO (3) are connected to global IO lines GIO (3) and ZGIO (3). In global IO lines GIO and ZGIO, paired global IO lines are not disposed adjacent to each other, also to alleviate the pitch condition of the block select gates.

Therefore, global IO lines GIO (0), ZGIO (0), GIO (1) and ZGIO (1) placed at one side in a row direction of the memory cell block correspond to adjacent bit line pairs BL (n), ZBL (n), and BL (n+1), ZBL (n+1) of the memory cell block. Similarly, global IO lines GIO (2), GIO (3), ZGIO (2) and ZGIO (3) placed at the other side of the memory cell block correspond to adjacent bit lines BL (n+2), ZBL (n+2), BL (n+3) and ZBL (n+3) of the memory cell block.

In operation, when column select line CSL (1) is selected, four column select gates CSG (n)–CSG (n+3) are selected, and adjacent bit line pairs of 4 bits are connected to local IO line pairs LIO (0), ZLIO (0)–LIO (3), ZLIO (3), respectively. If word line WL (m) is selected, memory cells of 4 bits, MC (m, n), MC (m, n+1), MC (m, n+2), and MC (m, n+3) are selected. Data writing or reading is performed for the selected memory cells, via global IO line pair GIOP and local IO line pair LIOP.

FIG. 19 is a diagram schematically showing a configuration of a preamplifier+write driver block for global IO line pairs of 8 bits. In FIG. 19, write/read amplifiers RW0–RW7 are provided corresponding to pairs of global IO lines GIO (0), ZGIO (0)–GIO (7), ZGIO (7), respectively. Select circuits SW0–SW7 are provided corresponding to respective write/read amplifiers RW0–RW7. Four select circuits SW0–SW3 are provided with column select signals Y (A)–Y (D), respectively, and four select circuits SW4–SW7 are provided with column select signals Y (A)–Y (D), respectively. Select circuits SW0–SW7 are rendered conductive when a test mode designating signal (a compression test mode designating signal) TESTA is activated.

Select circuits SW0–SW3, when conductive, connect corresponding wlitehread amplifiers RW0–RW3 to internal data bus lines DB (0), ZDB (0). Select circuits SW4–SW7, when conductive, connect corresponding write/read amplifiers RW4–RW7 to internal data bus lines DB (1), ZDB (1). Internal data bus lines DB (0), ZDB (0) and DB (1), ZDB (1) are coupled to external data terminals DQ0 and DQ1, respectively (via an input/output circuit).

In a normal operation mode, one out of 4 bits of column select signals Y (A)–Y (D) is driven to a selected state. Therefore, one of four select circuits SW0–SW3 is rendered conductive, and one of four write/read amplifiers RW0–RW3 is coupled to internal data lines DB (0), ZDB (0). One of select circuits SW4–SW7 is also rendered conductive, and one of wiite/read amplifiers RW4–RW7 is connected to internal data lines DB (1), ZDB (1). Thus, data wiiting/reading is performed for global IO line pairs of 2 bits out of 8 bits of global IO line pairs.

In a test operation mode, select circuits SW0–SW7 are all rendered conductive. Write/read amplifiers RW0–RW3 are connected, in parallel, to internal data lines DB (0), ZDB (0), and wlite/read amplifiers RW4–RW7 are also connected to internal data lines DB (1), ZDB (1) in parallel. The write/ read amplifiers or the global data line pairs connected to the same internal data bus line pair are coupled with the memory cells selected by the same column select line. For determination of match/mismatch of data for these memory cells of 4 bits, the 4-bit data can be compressed to 1bit data to determine pass/fail of the memory cells of 4 bits.

FIG. 20 is a diagram showing in more detail the configuration of the wlite/read amplifier and the select circuit shown in FIG. 19. In FIG. 20, the configurations of wiite/read amplifier RW1 and select circuit SW1 provided for global IO lines GIO (1) and ZGIO (1) are representatively shown.

Referring to FIG. 20, write/read amplifier RW1 includes: a write amplifier (write driver) WA for amplifying received data for transmission to global IO lines GIO (1) and ZGIO (1); and a read amplifier (preamplifier) RA for amplifying, when activated, complementary data signals applied onto global IO lines GIO (1) and ZGIO (1). Write amplifier WA is set at an output high impedance state when inactivated. These write amplifier WA and read amplifier RA are activated by an activation signal that is not specifically shown.

Select circuit SW1 includes: an OR/NAND composite gate G1 receiving a write designating signal WDE, test mode designating signal TESTA and column select signal Y (B); a select gate SG1 rendered conductive according to an output signal of OR/NAND composite gate G1 for coupling internal data lines DB (0)and ZDB (0) to write amplifier WA; an inverter G2 receiving test mode designating signal TESTA; an NAND gate G3 receiving an output signal of inverter G2, column select signal Y (B) and a read designating signal RDE; a select gate SG2 rendered conductive according to an output signal of NAND gate G3 for transmitting the output signal of read amplifier RA to internal data lines DB (0) and ZDB (0); an NAND gate G4 receiving the output signal of read amplifier RA, test mode designating signal TESTA and read designating signal RDE; a NAND gate G5 receiving a complementary output signal of read amplifier RA, test mode designating signal TESTA and read designating signal RDE; a drive transistor PG1 for driving internal data line DB (0) to an H level according to an output signal of NAND gate G4; and a drive transistor PG2 for driving complementary internal data line ZDB (0) to an H level according to an output signal of NAND gate G5.

OR/NAND composite gate G1 is equivalent to a configuration including an OR gate receiving test mode designating signal TESTA and column select signal Y (B), and a NAND gate receiving an output signal of the OR gate and write designating signal WDE.

In a normal operation mode, test mode designating signal TESTA is at an L level of an inactive state, output signals of NAND gates G4 and G5 are fixed at an H level, and diive transistors PG1 and PG2 keep an off state. With such a condition, in data writing, column select signal Y (B) and write designating signal WDE both attain an H level of an active state. The output signal of OR/NAND gate G1 then goes to an L level, select gate SG1 is rendered conductive, and complementary data on internal data lines DB (0) and ZDB (0) are transmitted to write amplifier WA. Write amplifier WA is activated according to a write driver enable signal (not shown) that is activated in response to write designating signal WDE, and amplifies the complementary data received from internal data line pair DB0 and transmits the amplified data to global IO lines GIO (1) and ZGIO (1).

Similarly, in data reading, column select signal Y (B) and read designating signal RDE both attain an H level of a selected state. The output signal of NAND gate G3 goes to an L level, and complementary data amplified by read amplifier RA are transmitted onto internal data line pair DB0.

In a test mode, test mode designating signal TESTA is driven to an H level of a selected state. The output signal of inverter G2 attains an L level, the output signal of NAND gate G3 is set to an H level, and select gate SG2 keeps a nonconductive state. In data writing, the output signal of OR/NAND composite gate G1 attains an L level in response to activation of write designating signal WDE, select gate SG1 is rendered conductive, and complementary data on data line pair DB0 are transmitted to write amplifier WA The logic level of column select signal Y (B) is disregarded in this test mode operation. Therefore, as shown in FIG. 19, write amplifiers WA of 4 bits connected to one data line pair receive the same data. In other words, select circuits SW0–SW7 in FIG. 19 are all rendered conductive. Thus, internal data lines DB (0), ZDB (0) are connected to write/read amplifiers RW0–RW3, and internal data lines DB (1), ZDB (1) are commonly coupled to write/read amplifiers RW4–RW7. Accordingly, the same data are written into memory cells of 4 bits selected by one column select line.

In data reading, when read designating signal RDE attains an H level, one of NAND gates, G4 or G5, which has received H level data from read amplifier RA outputs a signal of an L level. One of the drive transistors, PG1 or PG2, is thus rendered conductive, and one of the internal data lines, DB (0) or ZDB (0), is driven to an H level. The same data have been written into memory cells coupled to the same internal data line pair. If the H level data have been written therein, internal data line DB (0) is driven to an H level, and internal data line ZDB (0) is held at an L level (here, in the test mode, internal data lines DB (0) and ZDB (0) are precharged to the L level before data reading). In the case where there exists a defective memory cell in the memory cells of 4 bits selected by one column select line, reverse data are output from read amplifier RA. Thus, in this case, internal data lines DB (0) and ZDB (0) are both driven to the H level, or the reverse data of the write data are output (if all the bits are defective). The presence of a defect in the memory cells of 4 bits can be detected by comparing a signal on internal data line pair DB0 with an expected value.

In the IO compression test mode, data of the memory cells of 4 bits have been compressed to data of 1 bit, and the memory cells of 4 bits can be tested at one time. This can prevent the time required for the test from increasing even when the storage capacity of the semiconductor memory device increases.

FIG. 21 is a diagram schematically showing connection between selected memory cells and data terminals in the IO compression test mode in a conventional semiconductor memory device. Referring to FIG. 21, a data terminal DQ of 1 bit is coupled to internal data line pair DB. In the IO compression test mode, this internal data line pair DB is coupled to four global IO line pairs GIOa–GIOd. These global IO line pairs of 4 bits, GIOa–GIOd, are coupled via block select gates to local IO line pairs LIOa–LIOd, respectively. Local IO line pairs LIOa–LIOd are connected via column select gates CSG to memory cells MCa–MCd, respectively.

These memory cells of 4 bits, MCa–MCd, are selected simultaneously according to a column select signal on the same column select line CSL. Therefore, data applied to data terminal DQ are written into all 4 bits of these memory cells MCa–MCd. The data at the same logic level are also transmitted onto global IO line pairs GIOa–GIOd and local IO line pairs LIOa–LIOd. Accordingly, it is impossible to detect defects such as short circuits between global IO lines, between local IO lines or between adjacent memory cells. This is because the data at the same logic level are transmitted, and this logic level will not change even if a short circuit takes place.

A test decision circuit TDK simply compares data appeared on internal data line pair DB with an expected value and, according to their match/mismatch, detects the presence/absence of defects in the memory cells of 4 bits, or it only buffers read data for output to an outside. Therefore, in the array configuration shown in FIG. 18, for example, it is impossible to detect a short circuit of memory cells MC (m, n) and MC (m, n+1), or detect an effect of interference between the adjacent bit lines. Even if an IO compression test mode is utilized to shorten the test time, the test contents are limited. With the compression test mode, interference between bit lines, a short circuit of global IO lines, a short circuit of local IO lines or a short circuit between memory cells cannot be detected, and therefore, it is impossible to realize a precise test.

SUMMARY OF THE INVENTION

An object of the present invention is to provide a semiconductor memory device capable of performing a variety of tests efficiently even in an IO compression test mode.

Another object of the present invention is to provide a semiconductor memory device which can write an arbitrary data pattern into adjacent memory cells even in the IO compression test mode.

A semiconductor memory device according to the present invention includes: a memory array having a plurality of memory cells arranged in rows and columns; column select circuitry for simultaneously selecting a plurality of sets of memory cells of multiple bits from the memory array according to a column address; a plurality of data terminals; a plurality of internal data lines provided corresponding to the plurality of data terminals; and test switching circuitry for simultaneously coupling the plurality of sets of memory cells and the internal data lines in a test mode. The test switching circuitry includes a circuit for differentiating an internal data line coupled with a memory cell of at least 1 bit in each set of the memory cells, from an internal data line coupled with memory cell(s) of remaining bit(s) in the same set of the memory cells.

By coupling simultaneously selected memory cells to different internal data lines, it becomes possible to write data at different logic levels into the set of simultaneously selected memory cells. This enables testing of interference between bit lines or the like. Further, when these data transmission lines transmit data to respective memory cells, if adjacent data transmission lines transmit data at different logic levels, it is possible to detect a short circuit of the adjacent data transmission lines.

Moreover, memory cells in each set are coupled to different internal data lines, and the internal data lines are coupled to external terminals. Thus, a data pattern to be written into the memory cells in each set of the memory cells can be externally set to an arbitrary pattern. Accordingly, it is possible to perform a variety of tests even in an IO compression test mode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A and 6B are diagrams showing distribution of write data to memory cells in the semiconductor memory device according to the first embodiment of the present invention.

FIG. 7 is a diagram schematically showing a modification of the first embodiment of the present invention.

DESCRIPTION OF THE PREFERRED EMBODIMENTS

First Embodiment

Figure 1:
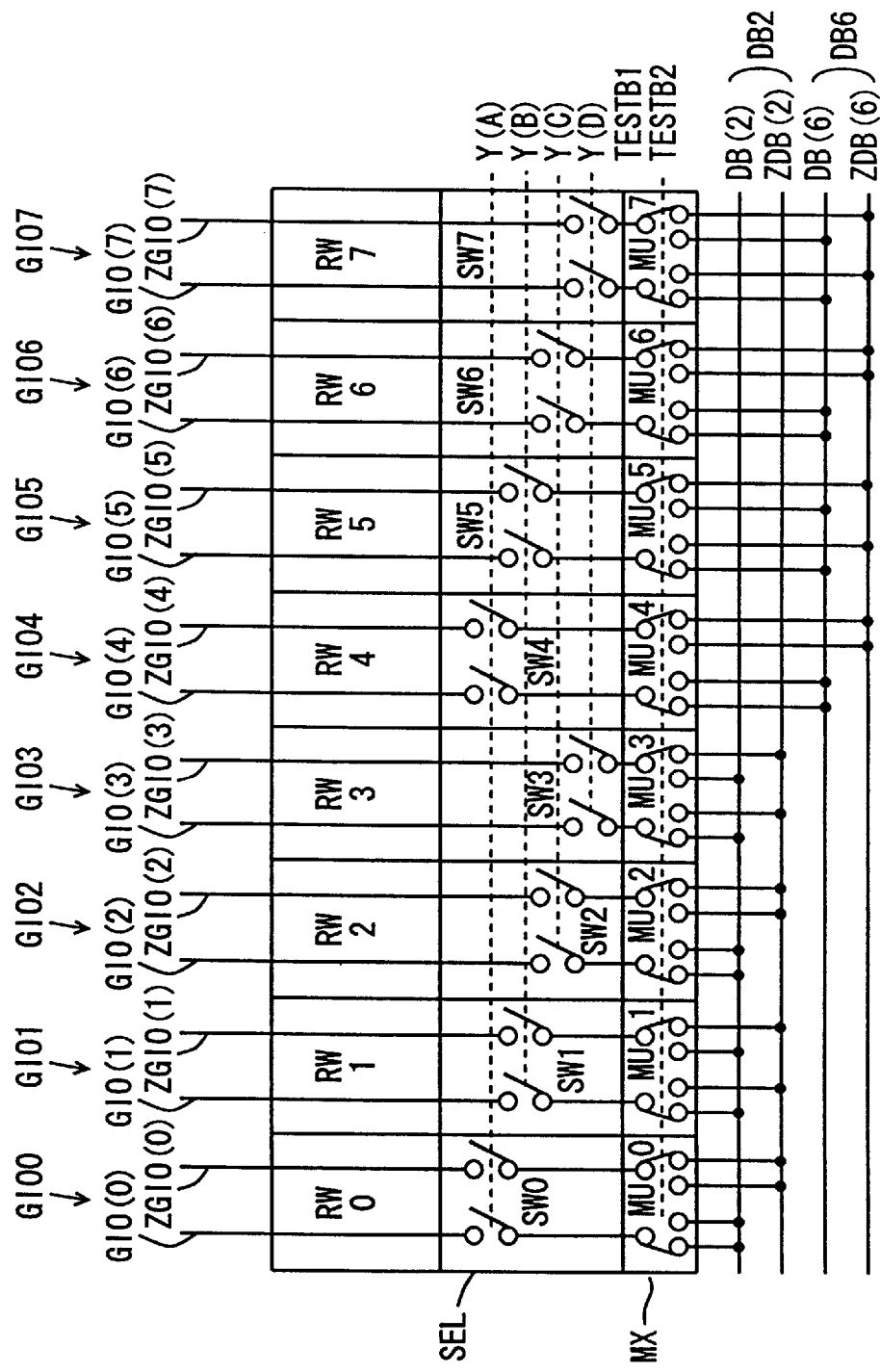
FIG. 1 is a diagram schematically showing a configuration of a main portion of a semiconductor memory device according to a first embodiment of the present invention

FIG. 1 schematically shows a configuration of a main portion of the semiconductor memory device according to the first embodiment of the present invention. In FIG. 1, a configuration of a portion related to global IO line pairs of 8 bits, GIO0–GIO7, is shown. Write/read amplifiers RW0–RW7 are provided corresponding to respective global IO line pairs GIO0–GIO7, as in the conventional case. Corresponding to write/read amplifiers RW0–RW7, a select circuit SEL is provided, which selects a global IO line pair of 1 bit out of 4 bits of global IO line pairs according to column select signals Y (A)–Y (D), and a switching circuit MX is provided, which switches connection between select circuit SEL and internal data line pairs DB2 and DB6 according to test mode designating signals TESTB1 and TESTB2

Select circuit SEL includes select circuits SW0–SW7 provided corresponding to respective write/read amplifiers RW0–RW7. These select circuits SW0–SW7 perform select operations according to column select signals Y (A)–Y (D)), as in the conventional case, and further select all the global IO line pairs when test mode designating signal TESTB1 is activated, regardless of the logic levels of column select signals Y (A)–Y (D)).

Switching circuit MX includes path setting circuits MU0–MU7 provided corresponding to respective select circuits SW0–SW7. These path setting circuits MU0–MU7 have their connection paths set according to test mode designating signal TESTB2. More particularly, path setting circuits MU1, MU3, MU5 and MU7 have their connection paths switched according to test mode designating signal TESTB2. In other words, path setting circuits MU0 and MU2 do not switch connection paths between internal data lines DB (2), ZDB (2) and select circuits SW0, SW2, regardless of test mode designating signal TESTB2. In contrast, path setting circuits MU1 and MU3 reverse connection between select circuits SW1, SW3 and internal data lines DB (2), ZDB (2) according to test mode designating signal TESTB2. Path setting circuits MU5 and MU7 also invert connection paths of internal data lines DB (6), ZDB (6) and select circuits SW5, SW7 according to test mode designating signal TESTB2. Path setting circuits MU4 and MU6 do not alter their connection paths regardless of a logic state of test mode designating signal TESTB2.

Therefore, it is possible to invert input/output data for write/read amplifiers RW0, RW2 and for write/read amplifiers RW1, RW3 to each other, according to test mode designating signal TESTB2. In other words, it is possible to transmit data having different logic levels to adjacent global IO line pairs, and correspondingly, it is possible to write data of different logic levels (reverse data) to adjacent bit line pairs and to adjacent memory cells. Further, it is possible to make all the connection paths of path setting circuits MU0–MU7 identical to each other dependent on the logic level of test mode designating signal TESTB2. It is thus possible to write data of the same logic level to all the selected memory cells.

The reason why internal data line pairs DB2 and DB6 are utilized will now be described.

This semiconductor memory device can take a DQ pin arrangement of ×4 bits, ×8 bits or ×16 bits. With the same internal configuration, the number of bits of data input/output is changed to accommodate the several types of DQ pin arrangements. For this reason, internal data line pairs for a maximal DQ bit width of 16 bits are disposed. In the case of ×16-bit configuration, global IO line pairs GIO0–GIO15 are coupled to respective internal data line pairs DB0–DB15. For the ×8-bit configuration, global IO line pairs GIO0–GIO15 are subjected to 2:1 selection, and coupled to internal data line pairs of 8 bits, DB0, DB2, DB4, DB6, DB9, DB11, DB13 and DB15.

Figures 2, 3:
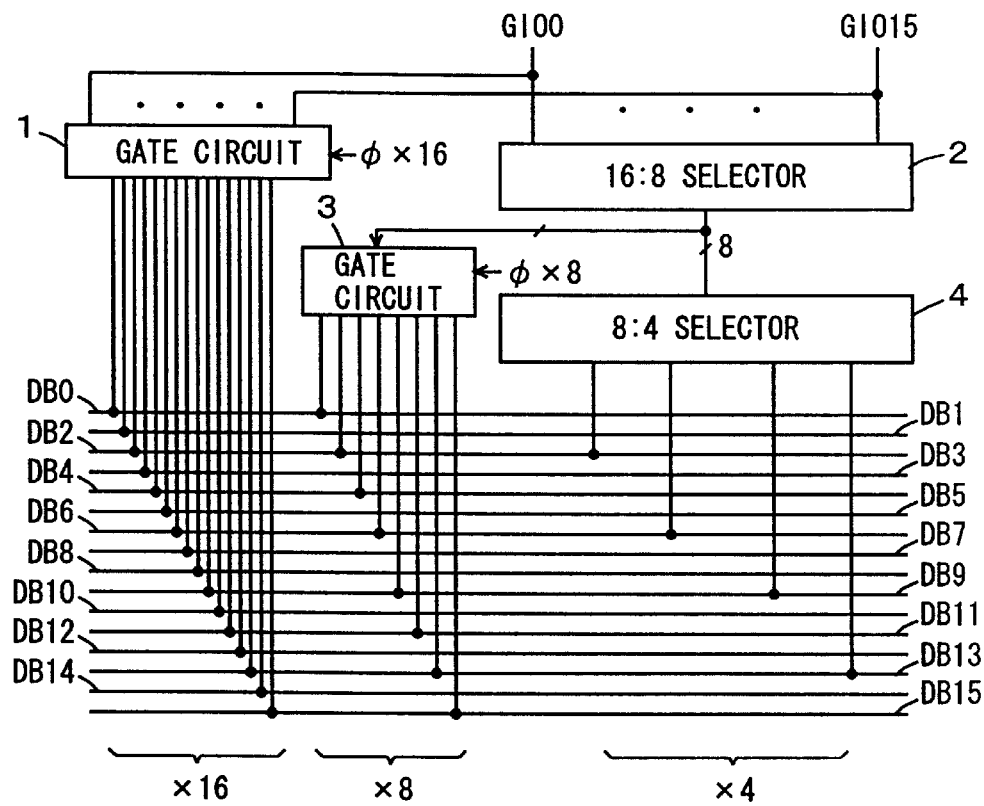
FIG. 2 is a diagram schematically showing connection paths of internal data buses and global IO lines in the semiconductor memory device according to the present invention.
FIG. 3 is a table showing a correspondence relation between internal data line pairs and data terminals.

In the case of ×4-bit configuration, global IO line pairs GIO0–GIO15 are subjected to 4:1 selection, and coupled to internal data line pairs DB2, DB6, DB9 and DB13. In the IO compression test mode, internal data line pairs of 4 bits, DB2, DB6, DB9 and DB13, used for every DQ pin configuration are utilized FIG. 2 schematically shows a functional configuration of the data switching unit. Referring to FIG. 2, the data switching unit includes: a gate circuit 1 that couples, when activated, global IO line pairs GIO0–GIO15 to internal data line pairs DB0–DB15; a 16:8 selector 2 that selects, when activated, global IO line pairs of 8 bits out of 16 bits of global IO line pairs GIO0–GIO15; a gate circuit 3 that connects, when activated, the 8 bits selected by 16:8 selector 2 to 8 bits of internal data line pairs DB0, DB2, DB4, DB6, DB9, DB11, DB13 and DB15; and an 8:4 selector 4 that further selects, when activated, 4 bits out of the 8 bits of global IO line pairs selected by 16:8 selector 2. The 8:4 selector 4 couples the internal data line pairs DB2, DB6, DB9 and DB13 with the 4 bits of global IO line pairs.

Select circuit SEL shown in FIG. 1 has the configurations of both 16:8 selector 2 and 8:4 selector 4. FIG. 2 only shows path selection of data lines functionally. A variety of configurations are possible to achieve such path selection.

Gate circuit 1 is rendered conductive when a ×16-bit configuration designating signal φx16 is activated. Gate circuit 3 is rendered conductive when a ×8-bit configuration designating signal φx8 is activated. These designating signals φx16 and φx8 are set fixedly by pad potential switching or the like. Select circuit SEL shown in FIG. 1 enters a ×16-bit mode when column select signals Y (A)–Y (D) are all driven to a selected state, and enters a ×8-bit mode when column select signals of 2 bits out of column select signals Y (A)–Y (D)) are driven to the selected state. In the ×4-bit test mode, one of the column select signals Y (A)–Y (D) is driven to the selected state. Note that, however, where a select gate is to be connected differs dependent on the data bit configuration (using the gate circuit in FIG. 2). The IO compression test mode is performed with this ×4-bit configuration. X 4-bit device, ×8-bit device and ×-16 bit device are all tested with the same test program, using the possible least number of data terminals.

FIG. 3 is a table representing a correspondence relation between internal data line pairs DB and external data terminals DQ. Referring to FIG. 3, in the case of ×16-bit configuration, internal data line pairs DB0–DB15 correspond to data terminals DQ0–DQ15, respectively.

In the case of ×8-bit configuration, internal data line pairs DB0, DB2, DB4, DB6, DB9, DB11, DB13 and DB15 correspond to data terminals DQ0–DQ7, respectively.

In the case of ×4-bit configuration, internal data line pairs DB2, DB6, DB9 and DB13 correspond to data terminals DQ0, DQ1, DQ2 and DQ3, respectively.

In the IO compression test mode, test data are written and test results are read both through data terminals DQ0, DQ1, DQ2 and DQ3 in the 4-bit configuration.

Figure 4:
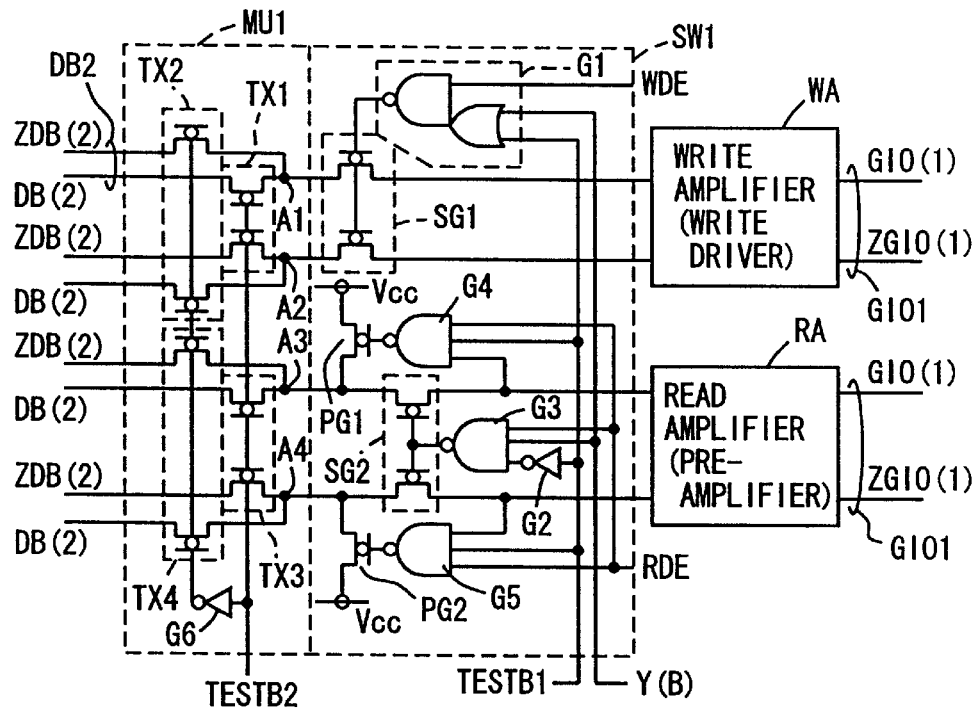
FIG. 4 is a diagram schematically showing a configuration of the select circuit shown in FIG. 1.
Figure 20:
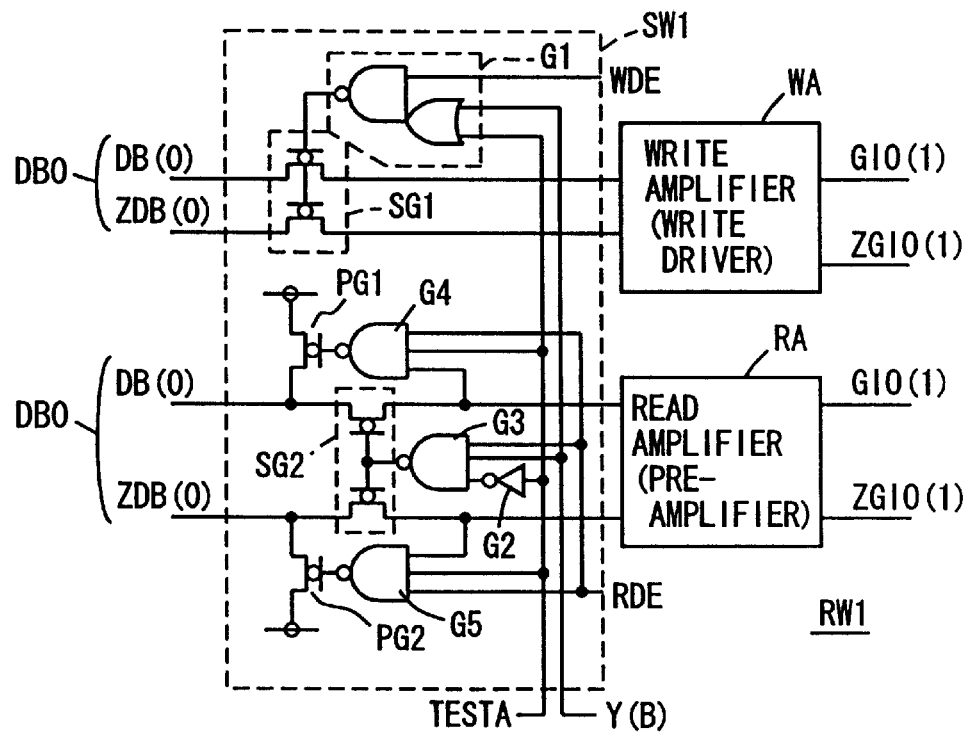
FIG. 20 is a diagram showing a configuration of the select circuit shown in FIG. 19.
Figure 21:
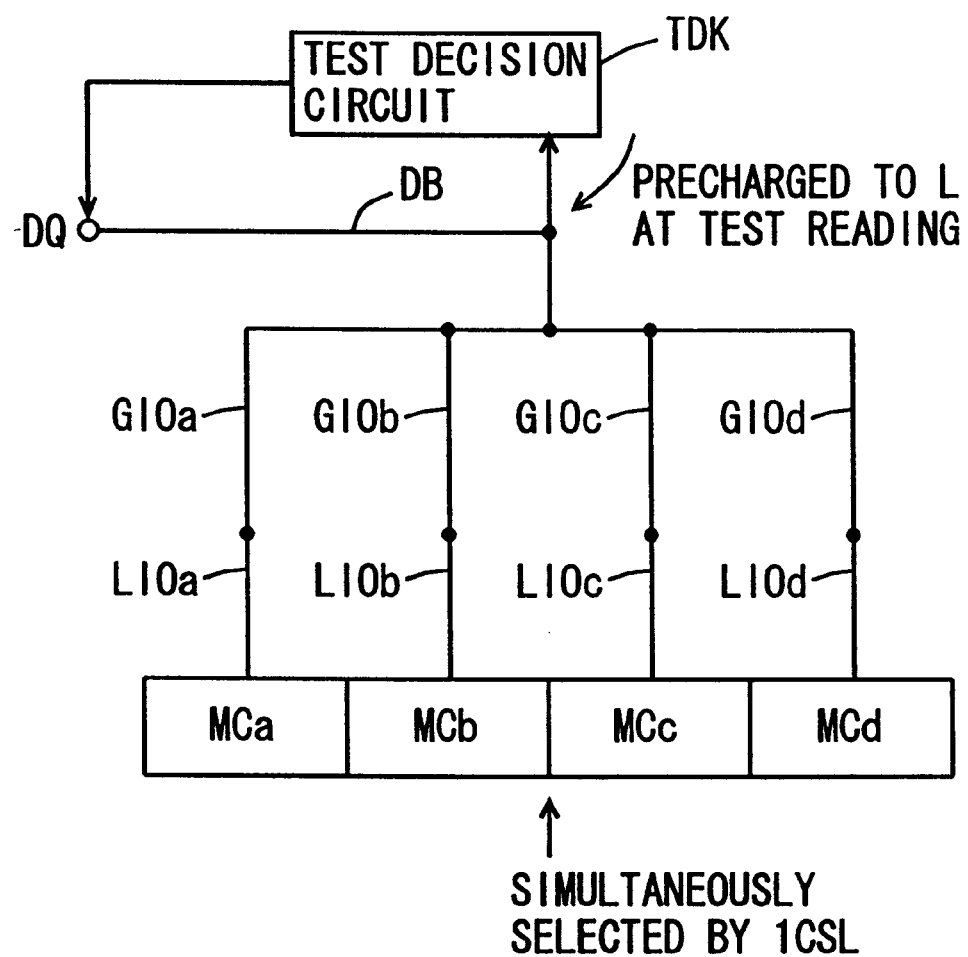
FIG. 21 is a diagram schematically showing connection between internal data line pairs and selected memory cells in the conventional semiconductor memory device.

FIG. 4 shows configurations of select circuit SW1 and path setting circuit MU1 for global IO line pair GIO1 shown in FIG. 1. Select circuit SW1 in FIG. 4 has a configuration identical to that of the conventional select circuit SW1 shown in FIG. 20, and includes: an OR/NAND composite gate G1 receiving test mode designating signal TESTB1, column select signal Y (B) and write designating signal WDE; a select gate SG1 rendered conductive according to an output signal of OR/NAND composite gate G1 for connecting nodes A1 and A2 to write amplifier WA, an inverter G2 inverting test mode designating signal TESTB1; a NAND gate G3 receiving an output signal of inverter G2, column select signal Y (B) and read designating signal RDE; a select gate SG2 rendered conductive, when an output signal of NAND gate G3 is at an L level, for connecting nodes A3 and A4 to read amplifier RA; a NAND gate G4 receiving an output signal of read amplifier RA, test mode designating signal TESTB1 and read designating signal RDE; a drive transistor PG1 rendered conductive, when an output signal of NAND gate G4 is at an L level, for driving node A3 to a power supply voltage Vcc level; a NAND gate G5 receiving a complementary output signal of read amplifier RA, test mode designating signal TESTB1 and read designating signal RDE; and a drive transistor PG2 rendered conductive, when an output signal of NAND gate G5 is at an L level, for driving node A4 to a power supply voltage Vcc level.

In a normal operation mode, test mode designating signal TESTB1 is at the L level, output signals of NAND gates G4 and G5 are fixed at the H level, and drive transistors PG1 and PG2 keep an off state. In data writing, select gate SG1 is rendered conductive according to column select signal Y (B) and write designating signal WDE, and nodes A1 and A2 are coupled to write amplifier WA In data reading, select gate SG2 is rendered conductive according to column select signal Y (B) and read designating signal RDE, and read data from read amplifier RA are transmitted to nodes A3 and A4.

In the case of a test mode, in data writing, select gate SG1 is rendered conductive when write designating signal WDE is activated, regardless of the logic level of column select signal Y (B), and nodes A1 and A2 are coupled to write amplifier WA. In data reading, when read designating signal RDE is activated, either one of the output signals of NAND gates G4 and G5 (the gate receiving the H level data from read amplifier RA) attains an L level. Responsively, one of drive transistors PG1 and PG2, is rendered conductive, and one of nodes A3 and A4 is driven to the power supply voltage Vcc level.

Path setting circuit MU1 includes: a connection gate TX1 rendered conductive, when test mode designating signal TESTB2 is at the L level, for connecting internal data lines DB (2) and ZDB (2) to nodes A1 and A2; a connection gate TX2 rendered conductive, when an inverted signal of test mode designating signal TESTB2 applied via inverter G6 is at the L level (i.e., when signal TESTB2 is at the H level,) for connecting internal data lines ZDB (2) and DB (2) to internal nodes A1 and A2, respectively; a connection gate TX3 rendered conductive, when test mode designating signal TESTB2 is at the L level, for connecting internal data lines DB (2) and ZDB (2) to nodes A3 and A4; and a connection gate TX4 rendered conductive, when the output signal of inverter G6 is at the L level, for connecting internal data lines ZDB (2) and DB (2) to nodes A3 and A4. Connection gates TX2 and TX4, and connection gates TX1 and TX3 are rendered conductive complementary to each other.

In the normal operation mode, test mode designating signal TESTB2 is at the L level, and connection gates TX1 and TX3 are rendered conductive. Internal data line DB (2) is connected to nodes A1 and A3, and internal data line ZDB (2) is connected to nodes A2 and A4.

In the test mode, for switching paths, test mode designating signal TESTB2 attains the H level, and connection gates TX2 and TX4 are rendered conductive. Internal data line ZDB (2) is connected to nodes A1 and A3, and internal data line DB (2) is connected to nodes A2 and A4. Therefore, when this test mode designating signal TESTB2 is at the H level, reverse data of the data on internal data line pair DB2 are transmitted to nodes A1 and A2, and inverted data of the data read out from read amplifier RA are transmitted to internal data line pair DB2.

Figure 5:
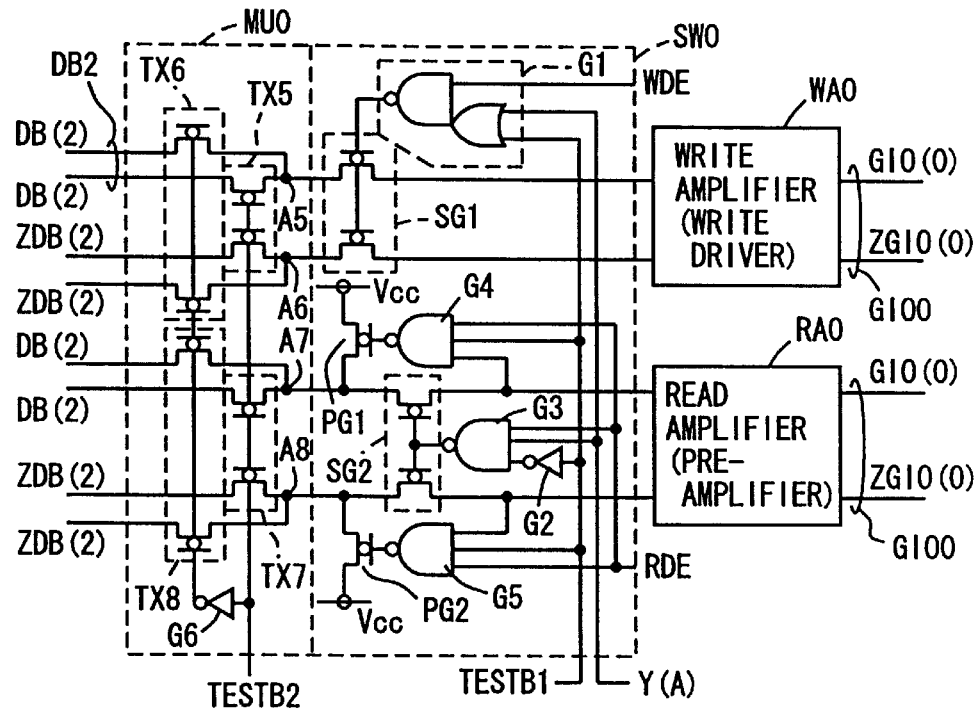
FIG. 5 is a diagram schematically showing another configuration of the select circuit of FIG. 1.

FIG. 5 shows configurations of the select circuit and the switching circuit for global IO line pair GIO0. Referring to FIG. 5, the configuration of select circuit SW0 is identical to that of select circuit SW1 shown in FIG. 4, except for that it receives column select signal Y (A) instead of column select signal Y (B). Therefore, the portions in select circuit SW0 corresponding to those in select circuit SW1 are denoted by the same reference characters, and detailed description thereof win not be repeated.

Path setting circuit MU0 includes: a connection gate TX5 rendered conductive, when test mode designating signal TESTB2 is at the L level, for connecting internal data lines DB (2) and ZDB (2) to nodes AS and A6; a connection gate TX6 rendered conductive, when a complementary test mode designating signal applied to inverter G6 is at the L level for connecting internal data lines DB (2) and ZDB (2) to nodes A5 and A6; a connection gate TX7 rendered conductive, when test mode designating signal TESTB2 is at the L level, for connecting internal data lines DB (2) and ZDB (2) to nodes A7 and A8; and a connection gate TX8 rendered conductive when test mode designating signal TESTB2 is at the H level for connecting internal data lines DB (2) and ZDB (2) to nodes A7 and A8.

In this path setting circuit MU0, connection paths between internal data lines DB (2) and ZDB (2) and internal nodes A5, A6 and A7, A8 remain unchanged regardless of whether test mode designating signal TESTB2 is at the H level or at the L level. Internal data line DB (2) is connected to nodes A5 and A7, and internal data line ZDB (2) is connected to nodes A6 and A8. Thus, with path setting circuit MU0 and select circuit SW0, the data on internal data line pair DB2 are transmitted via write amplifier WA0 to global IO line pair GIO0, and, in data reading, the data read out from read amplifier RA0 are transmitted to internal data line pair DB2.

FIG. 6A illustrates write data to memory cells selected by one column select line CSL in the IO compression test mode. Referring to FIG. 6A, when test mode designating signal TESTB2 is set at the L level, path setting circuits MU (MU0–MU7) connect internal data line pairs DB2 and DB6 to select circuits SW0–SW7 all in the same manner. Therefore, as shown in FIG. 6A, memory cells MCa–MCd simultaneously selected by one column select line CSL receive and store the same data D transmitted via global IO line pairs GIOa–GIOd.

In contrast, in the case where test mode designating signal TESTB2 is set at the H level, connection paths of path setting circuits MU1, MU3, MU5 and MU7 are reversed from those of path setting circuits MU0, MU2, MU4 and MU6. Thus, as shown in FIG. 6B, memory cells MCa and MCc receive and store data D transferred on internal data line pair DB, whereas memory cells MCb and MCd receive and store inverted data ZD of the data D transferred on internal data line pair DB. Accordingly, by transferring data D from external data terminals, data different in their logic levels can be written into adjacent memory cells. These inverted data are transferred via global IO line pairs GIO. This means that a short circuit in adjacent global IO line pairs as well as a short circuit between adjacent memory cells can be detected. Accordingly, it is possible to detect a defect due to a short circuit, utilizing the IO compression test mode.

Modification

FIG. 7 shows a modification of select circuit SW1 provided for global IO line pair GIO1. Referring to FIG. 7, select circuit SW1 includes: EXOR gates G7 and G8 each operating as a buffer when test mode designating signal TESTB2 is at the L level, for transmitting data from select gate SG1 to write amplifier WA; and EXOR gates G9 and G10 each operating as a buffer when test mode designating signal TESTB2 is at the L level, for transmitting read data from read amplifier RA to select gate SG2.

In this select circuit SW1, a gate circuit for controlling conduction of select gates SG1 and SG2, and a drive transistor for driving internal data lines DB (2) and ZDB (2) according to read data in the IO compression test mode are not shown.

Select gates SG1 and SG2 are both connected to internal data lines DB (2) and ZDB (2).

With the configuration shown in FIG. 7, when test mode designating signal TESTB2 is at the L level, EXOR gates G7, G8, G9 and G10 operate as buffer circuits. Thus, the data applied from internal data lines DB (2) and ZDB (2) via select gate SG1 are transmitted to write amplifier WA, and in data reading, read data from read amplifier RA are transmitted via EXOR gates G9 and G10.

In contrast, when test mode designating signal TESTB2 is at the H level, EXOR gates G7, G8, G9 and G10 operate as inverter buffers. Thus, in data writing, data applied from select circuit SG1 are inverted and transmitted to write amplifier WA, and in data reading, data read by read amplifier RA are inverted and transmitted to select gate SG2.

Accordingly, it is possible to selectively write either inverted data or data on the internal data line to a memory cell via global IO line pair GIO1 and to read out the written data intactly or after inversion, according to the test mode designating signal TESTB2.

If test mode designating signal TESTB2 is fixed at the L level, EXOR gates G7–G10 all operate as buffer circuits. In this case, data are not inverted, and therefore a ground voltage instead of test mode designating signal TESTB2 is transmitted to select circuits SW0, SW2, . . . corresponding to global IO line pairs GIO0, GIO2, GIO4, GIO6, . . . Thus, it becomes possible to provide reverse data in adjacent global IO line pairs or adjacent memory cells.

In the configuration shown in FIG. 7, EXOR circuits G7 and G8 may be used in combination with write amplifier WA, and EXOR gates G9 and G10 may be used in combination with read amplifier RA.

As explained above, according to the first embodiment of the present invention, connection between internal data lines and global IO line pairs can be altered according to a test mode designating signal. Thus, even in an IO compression test mode, it is possible to provide reverse data to adjacent global IO line pairs and to memory cells in adjacent columns.

Second Embodiment

Figure 8:
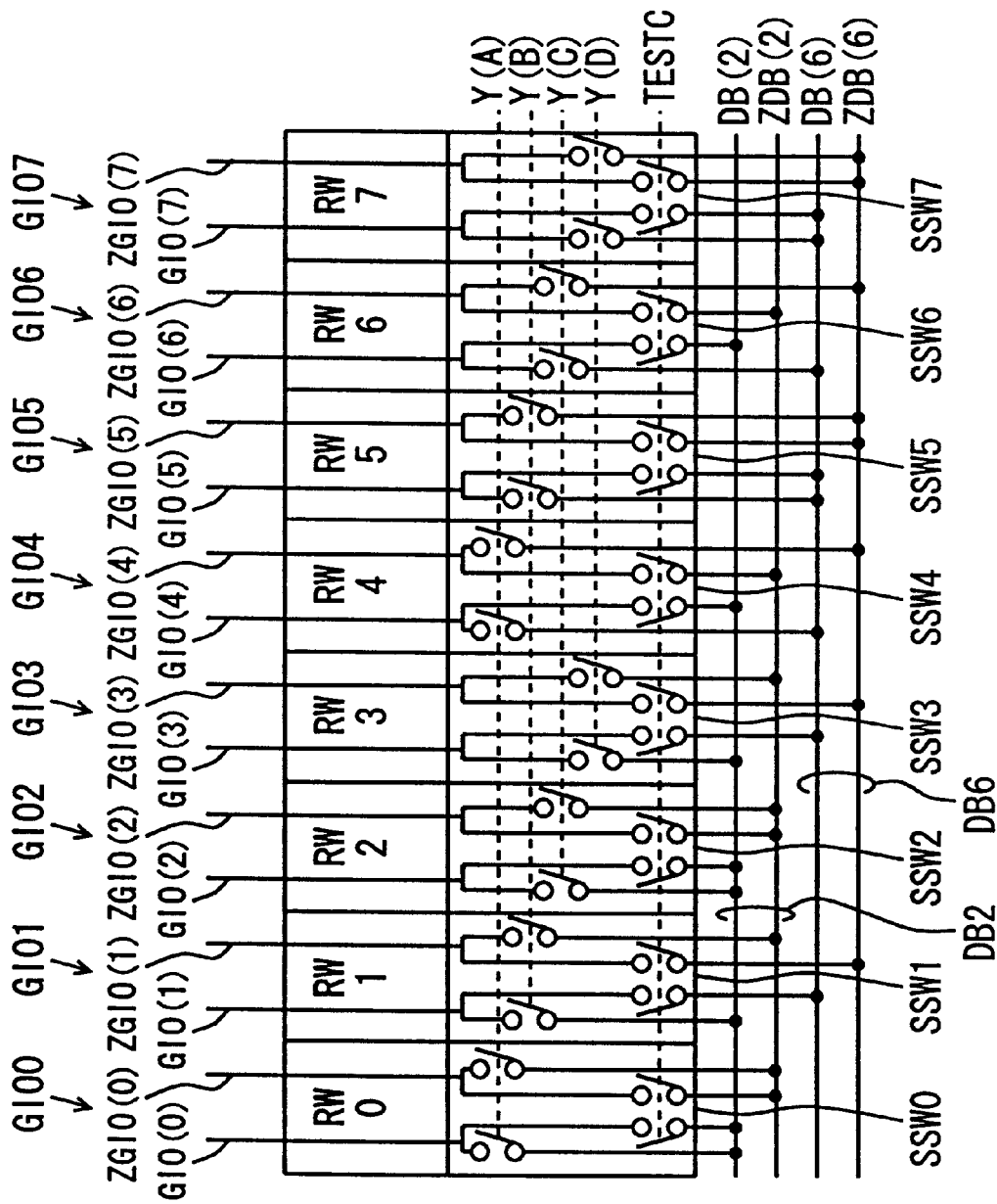
FIG. 8 is a diagram schematically showing a configuration of a main portion of a semiconductor memory device according to a second embodiment of the present invention.
Figure 16:
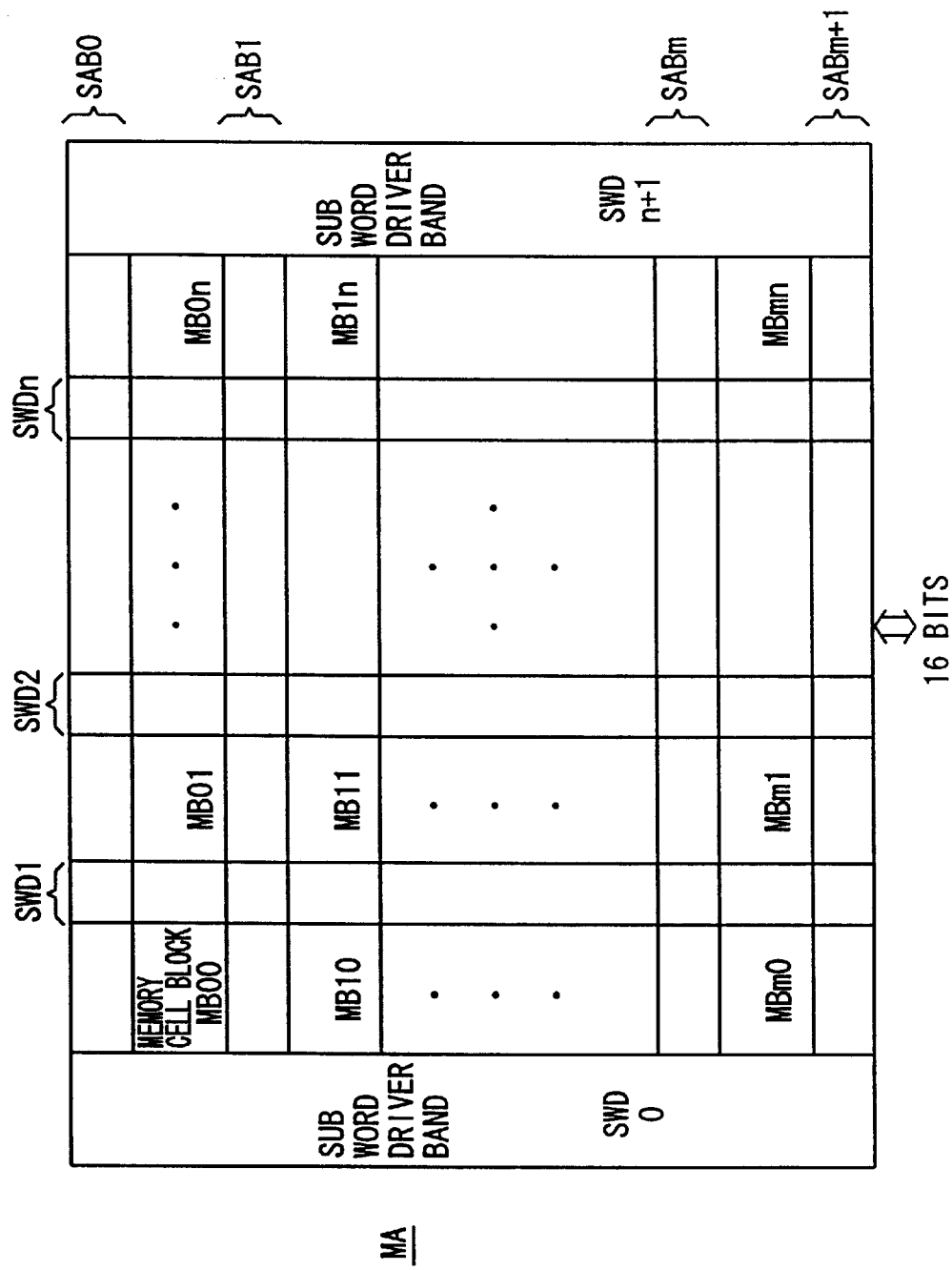
FIG. 16 is a diagram schematically showing a configuration of one memory array of the semiconductor memory device shown in FIG. 15.
Figure 17:
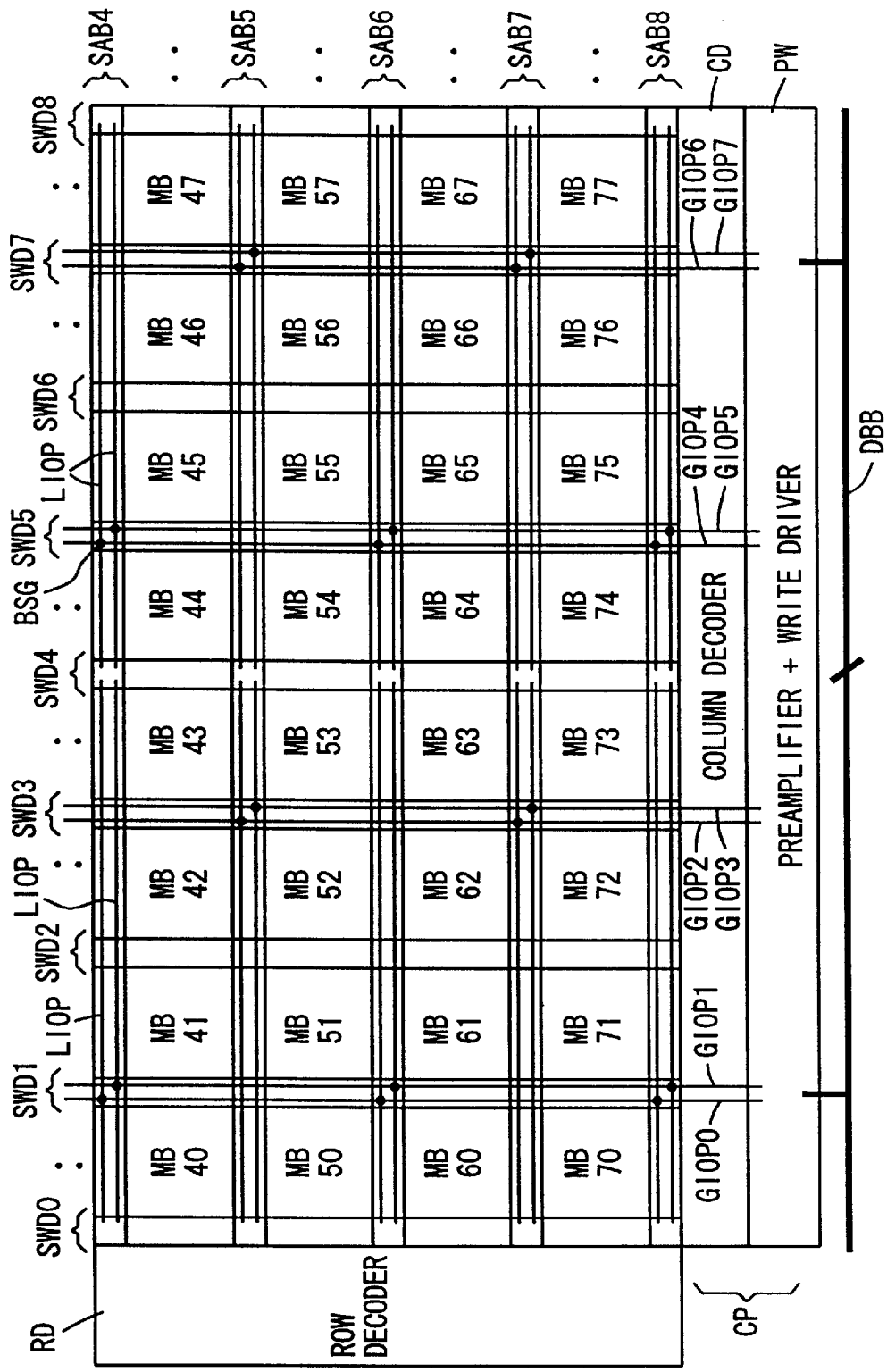
FIG. 17 is a diagram schematically showing an arrangement of internal data transmission lines in the memory array shown in FIG. 16.
Figure 18:
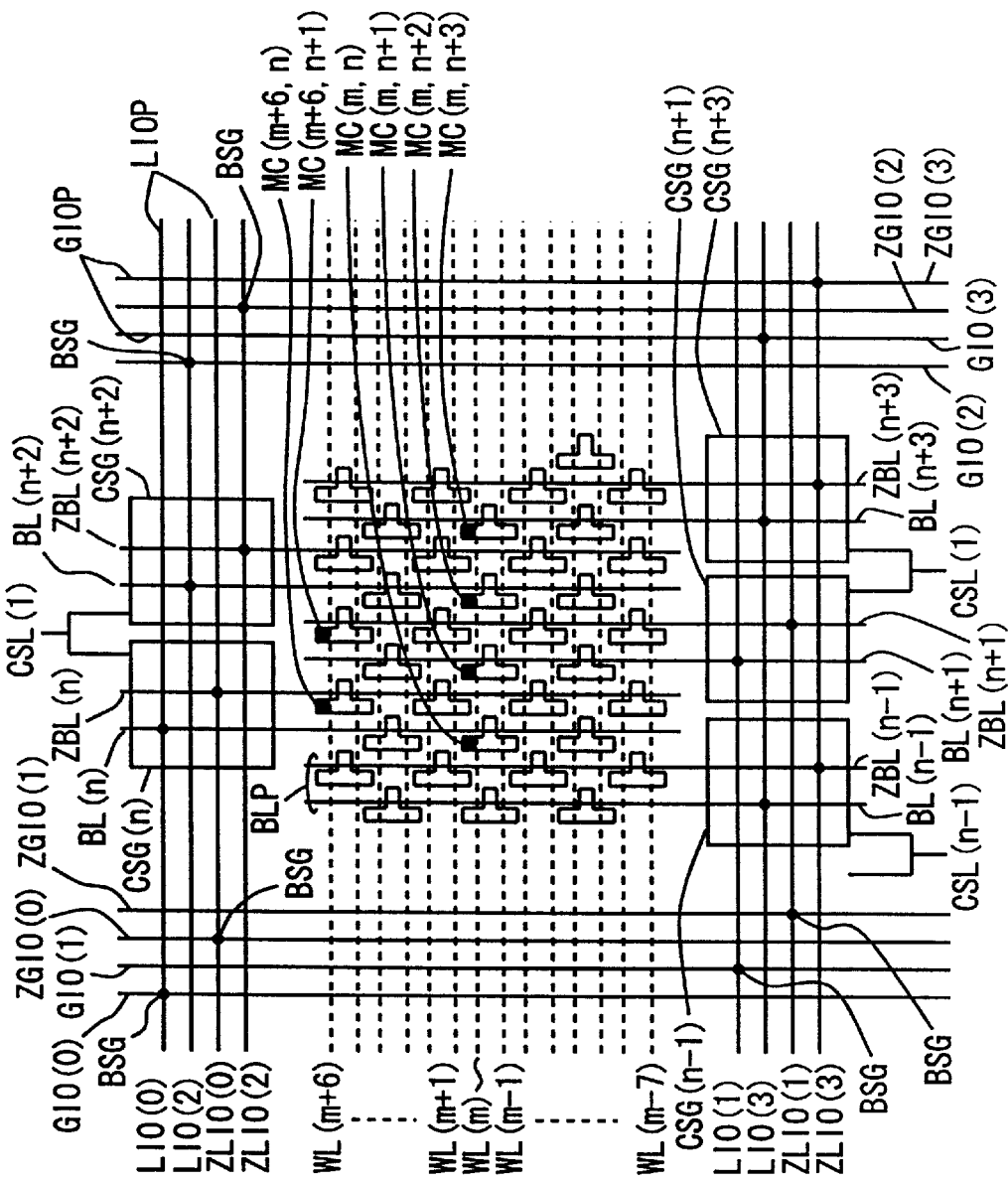
FIG. 18 is a diagram schematically showing a configuration of a portion of the memory array of FIG. 15, for one memory cell block.
Figure 19:
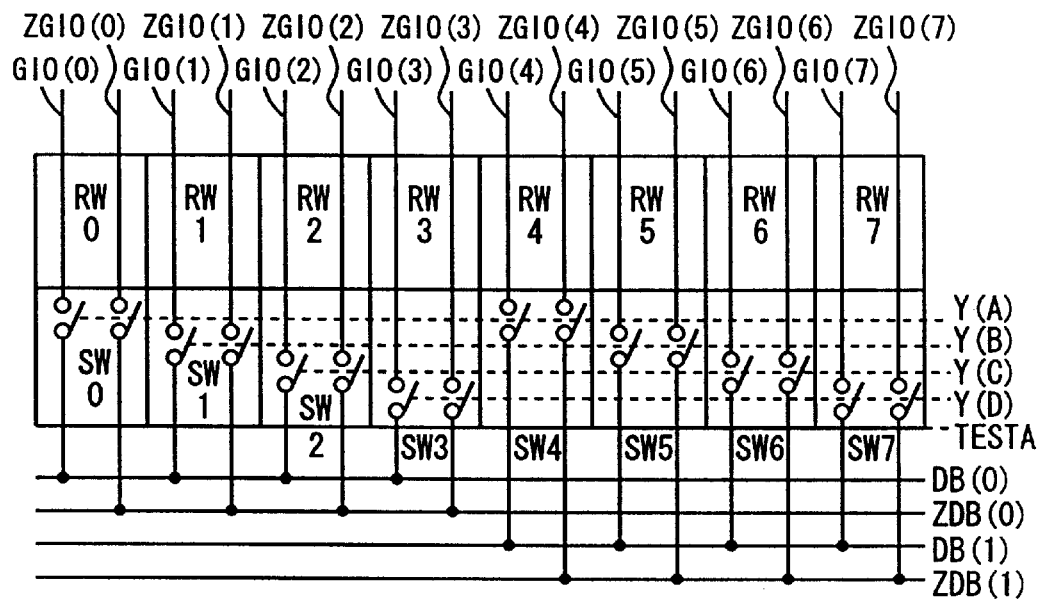
FIG. 19 is a diagram schematically showing a configuration of the preamplifier + write driver block shown in FIG. 17.

FIG. 8 shows a configuration of a main portion of the semiconductor memory device according to the second embodiment of the present invention. A configuration of a portion for global IO line pairs of 8 bits is shown in FIG. 8. The configuration of the memory array is the same as the conventional one shown in FIGS. 16 to 18. Referring to FIG. 8, select circuits SSWO–SSW7 are provided corresponding to respective write/read amplifiers RW0–RW7. In a normal operation mode, select circuits SSW0 and SSW2 couple corresponding global IO line pairs GIO0 and GIO2 to internal data line pair DB2 via corresponding wlite/read amplifiers RW0 and RW2, according to column select signals Y (A) and Y (C). These select circuits SSW0 and SSW2 couple global IO line pairs GIO0 and GIO2 to internal data line pair DB2 when test mode designating signal TESTC is activated, regardless of the logic levels of column select signals Y (A) and Y (C).

In the normal operation mode, select circuits SSW1 and SSW3 couple corresponding global IO line pairs GIO1 and GIO3 to internal data line pair DB2 via write/read amplifiers RW1 and RW3, according to column select signals Y (B) and Y (D)). In contrast, when test mode designating signal TESTC is activated, select circuits SSW1 and SSW3 couple corresponding global IO line pairs GIO1 and GIO3 to internal data line pair DB6 via write/read amplifiers RW1 and RW3, regardless of the logic levels of column select signals Y (B) and Y (D).

In the normal operation mode, select circuits SSW4 and SSW6 selectively couple corresponding global IO line pairs GIO4 and GIO6 to internal data line pair DB6 via write/read amplifiers RW4 and RW6, according to column select signals Y (A) and Y (C). Conversely, when test mode designating signal TESTC is activated, they couple global IO line pairs GIO4 and GIO6 to internal data line pair DB2 via write/read amplifiers RW4 and RW6, regardless of the logic levels of column select signals Y (A) and Y (C).

In the normal operation mode, select circuits SSW5 and SSW7 couple corresponding global IO line pairs GIO5 and GIO7 to internal data line pair DB6 via write/read amplifiers RW5 and RW7, according to column select signals Y (B) and Y (D), and when test mode designating signal TESTC is activated, couple global IO line pairs GIO5 and GIO7 to internal data line pair DB6 via write/read amplifiers RW5 and RW7, regardless of the logic levels of column select signals Y (B) and Y (D).

In select circuits SSW0–SSW7 shown in FIG. 8, adjacent global IO line pairs are coupled to different internal data line pairs in a test mode. More specifically, when test mode designating signal TESTC is activated, global IO line pairs GIO0, GIO2, GIO4 and GIO6 are coupled to internal data line pair DB2, whereas global IO line pairs GIO1, GIO3, GIO5 and GIO7 are coupled to internal data line pair DB6. Internal data line pairs DB2 and DB6 are connected to external data terminals. Thus, data in these adjacent global IO line pairs or in adjacent (column) memory cells can be set by data to be applied to the external data terminals. Further, it is possible to write reverse data or the same data into adjacent memory cells.

Figure 9A:
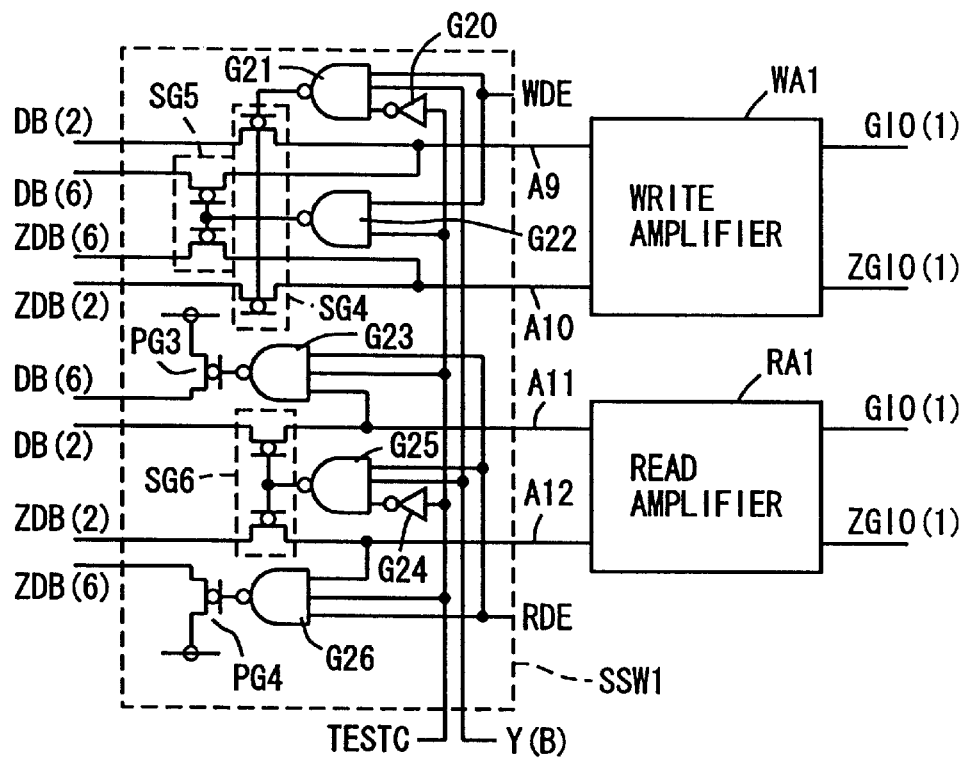
FIGS. 9A and 9B are diagrams showing configurations of the select circuit shown in FIG. 8.

FIG. 9A shows a configuration of select circuit SSW1 shown in FIG. 8. Referring to FIG. 9A, select circuit SSW1 includes: an inverter G20 inverting test mode designating signal TESTC; a NAND gate G21 receiving an output signal of inverter G20, column select signal Y (B) and write designating signal WDE; a NAND gate G22 receiving test mode designating signal TESTC and write designating signal WDE; a select gate SG4 rendered conductive, when an output signal of NAND gate G21 is at an L level, for connecting nodes A9 and A10 to internal data lines DB (2) and ZDB (2); and a select gate SG5 rendered conductive, when an output signal of NAND gate G22 is at an L level, for connecting nodes A9 and A10 to internal data lines DB (6) and ZDB (6), respectively. The signals on nodes A9 and A10 are applied to write amplifier WA1. Write amplifier WA1, when activated, drives global IO lines GIO (1) and ZGIO (1) according to the signals applied to nodes A9 and A10.

Select circuit SSW1 further includes: a NAND gate G23 receiving a signal on node A11, test mode designating signal TESTC and read designating signal RDE; an inverter G24 inverting test mode designating signal TESTC; a NAND circuit G25 receiving an output signal of inverter G24, column select signal Y (B) and read designating signal RDE; a NAND gate G26 receiving a signal on node A12, test mode designating signal TESTC and read designating signal RDE; a select gate SG6 rendered conductive, when an output signal of NAND gate G25 is at an L level, for connecting nodes A11 and A12 to internal data lines DB (2) and ZDB (2); a drive transistor PG3 rendered conductive, when an output signal of NAND gate G23 is at an L level, for driving internal data line DB (6) to a power supply voltage Vcc level; and a drive transistor PG4 rendered conductive, when an output signal of NAND circuit G26 is at an L level, for driving internal data line ZDB (6) to a power supply voltage level. Read amplifier RA1, when activated, amplifies signals appeared on global IO lines GIO (1) and ZGIO (1), and transmits the amplified signals to nodes A11 and A12.

In select circuit SSW1 shown in FIG. 9A, when test mode designating signal TESTC is at the L level, the output signals of NAND gates G22, G23 and G26 are all fixed at the H level. In data writing, NAND gate G21 drives select gate SG4 to a conductive state according to column select signal Y (B) and write designating signal WDE. In contrast, in data reading, the output signal of NAND gate G25 sets select gate SG6 to a conductive state according to read designating signal RDE and column select signal Y (B), and internal nodes A11 and A12 are connected to internal data lines DB (2) and ZDB (2). Thus, in the normal operation mode, data are transferred between internal data lines DB (2), ZDB (2) and global IO lines GIO (1), ZGIO (1).

In a test mode, test mode designating signal TESTC attains an H level. The output signals of NAND gates G21 and G25 are driven to an H level, and select gates SG4 and SG6 are set to a nonconductive state. In data writing, NAND gate G22 drives select gate SG5 to a conductive state in response to activation of write designating signal WDE, for connecting internal data lines DB (6) and ZDB (6) to nodes A9 and A10. In contrast, in data reading, either one of the output signals of NAND gates G23 and G26 attains an L level, and one of internal data lines DB (6) and ZDB (6) is driven to a power supply voltage level by drive transistor PG3 or PG4. Thus, in the test mode, test data are transferred between internal data lines DB (6), ZDB (6) and global IO lines GIO (1), ZGIO (1).

Figure 9B:
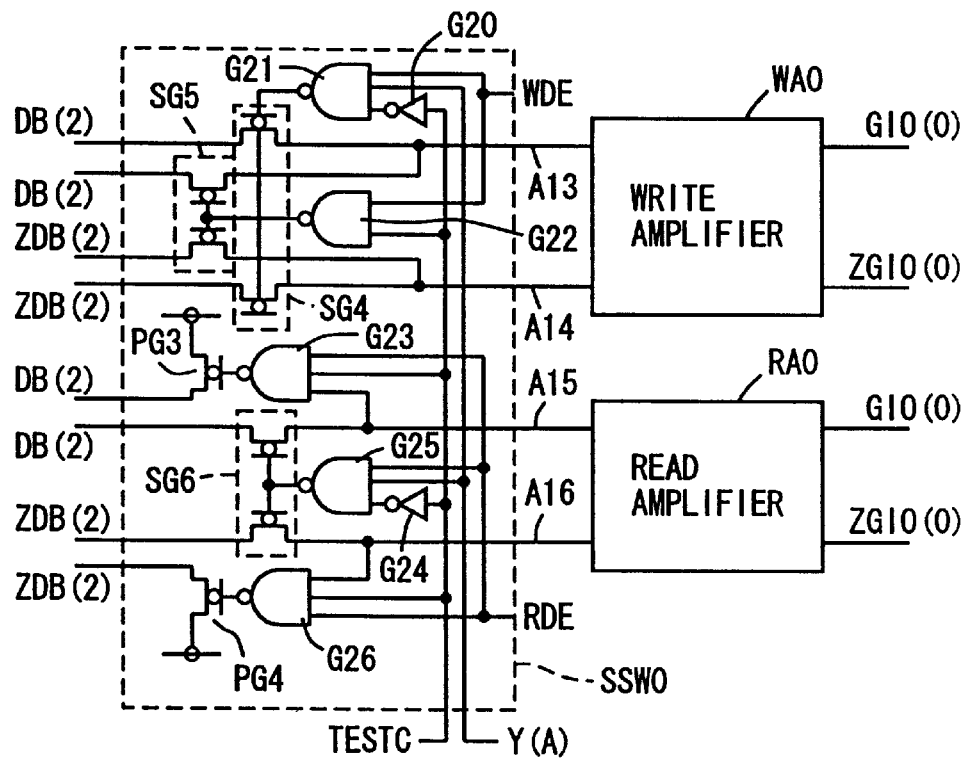

FIG. 9B shows a configuration of select circuit SSW0 shown in FIG. 8. The configuration of select circuit SSW0 is identical to that of select circuit SSW1 shown in FIG. 9A, except for that column select signal Y (A) instead of column select signal Y (B) is applied, and internal data lines DB (2) and ZDB (2) instead of internal data lines DB (6) and ZDB (6) are connected. Therefore, the portions in select circuit SSW0 corresponding to those in select circuit SSW1 are denoted by the same reference characters, and detailed description thereof is not repeated.

In select circuit SSW0, both in the normal operation mode and in the test operation mode, input nodes A13 and A14 of write amplifier WA0 are connected to internal data lines DB (2) and ZDB (2), and output nodes A15 and A16 of read amplifier RA0 are coupled to internal data lines DB (2) and ZDB (2).

Select circuits SSW4 and SSW6 are different from select circuit SSW1 shown in FIG. 9A in the positions of internal data lines. Select circuits SSW5 and SSW7 are connected to internal data lines DB (6) and ZDB (6), instead of internal data lines DB (2) and ZDB (2), in the configuration of select circuit SSW0 shown in FIG. 9B.

Figure 10:
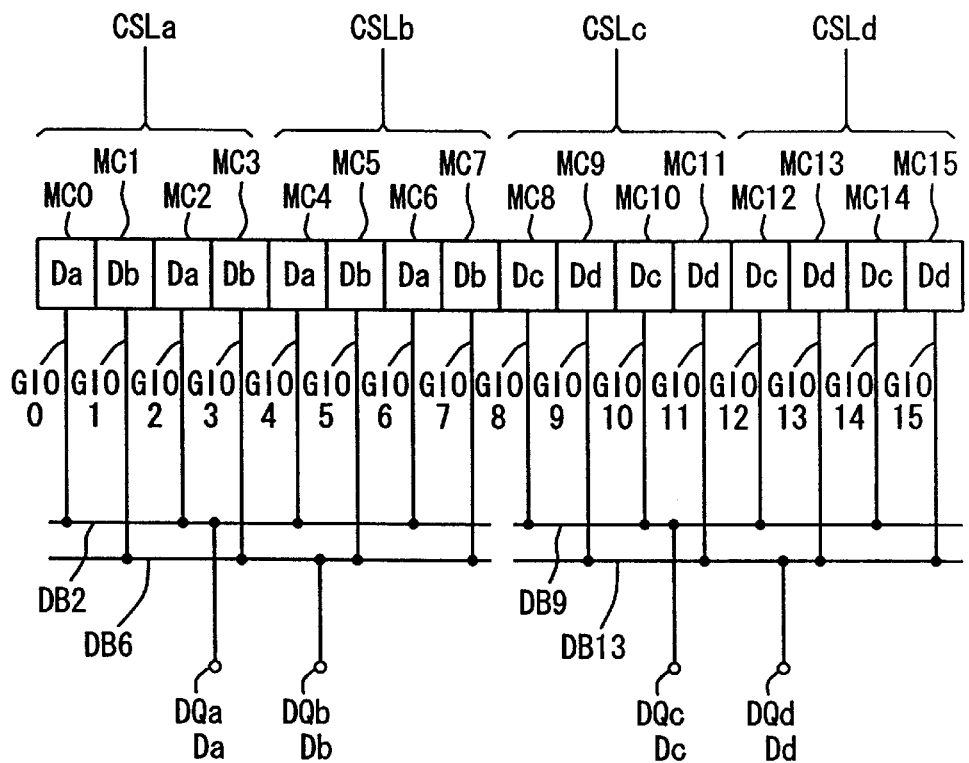
FIG. 10 is a diagram schematically showing connection between memory cells and internal data line pairs according to the second embodiment of the present invention.

FIG. 10 schematically shows connection between internal data line pairs DB2, DB6, DB9 and DB13 and memory cells MC0–MC15 in the IO compression test mode. Memory cells MCO–MC3 are selected by a column select signal on column select line CSLa, memory cells MC4–MC7 are selected by a column select signal on column select line CSLb, memory cells MC8–MC11 are selected by a column select signal on column select line CSLc, and memory cells MC12–MC15 are selected by a column select signal on column select line CSLd. Memory cells MO0–MC15 are coupled to global IO line pairs GIO0–GIO15, respectively.

In the IO compression test mode, global IO line pairs GIO0, GIO2, GIO4 and GIO6 are coupled to internal data line pair DB2, and global IO line pairs GIO1, GIO3, GIO5 and GIO7 are coupled to internal data line pair DB6. Global IO line pairs GIO8, GIO10, GIO12 and GIO14 are coupled to internal data pair DB9, and global IO line pairs GIO9, GIO11, GIO13 and GIO15 are coupled to internal data line pair DB13.

Internal data line pairs DB2, DB6, DB9 and DB13 are coupled to data terminals DQa, DQb, DQc and DQd, respectively.

These data terminals DQa–DQd are provided with data Da–Dd. Data Da is written to memory cells MC0, MC2, MC4 and MC6, data Db is stored in memory cells MC1, MC3, MC5 and MC7, data Dc is written to memory cells MC8, MC10, MC12 and MC14, and data Dd is written to memory cells MC9, MC11, MC13 and MC15.

Accordingly, in a set of memory cells simultaneously selected by one column select line, adjacent memory cells can be provided with reverse data. In addition, by changing the logic values of data Da–Dd, the same data can be written into all the memory cells MC0–MC 15. Data of the same logic value and data of opposite logic value can be written into adjacent memory cells, by simply setting the logic values of write data from the outside. Thus, it is possible to detect a short circuit between global IO line pairs, a short circuit between adjacent bit line pairs and a short circuit of adjacent memory cells, even at the time of the IO compression test.

Figure 11A:
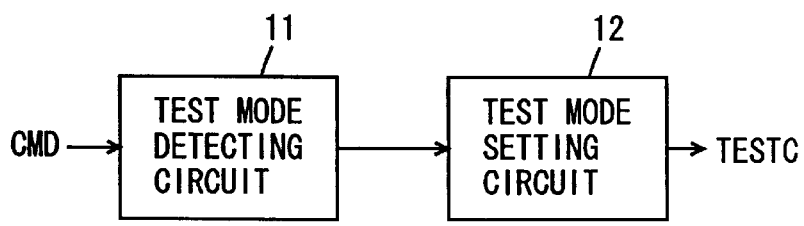
FIG. 11A schematically shows a configuration of a test designating signal generating unit.

FIG. 11A schematically shows a configuration of a test mode designating signal generating unit. Referring to FIG. 11A, the test mode designating signal generating unit includes: a test mode detecting circuit 11 receiving an external command CMD to detect whether the test mode is designated or not; and a test mode setting circuit 12 driving test mode designating signal TESTC to an active state according to a test mode detection signal from test mode detecting circuit 11. Test mode detecting circuit 11 also detects a completion of the test mode when command CMD designates the test mode completion, to inactivate test mode designating signal TESTC from test mode setting circuit 12.

Figure 11B:
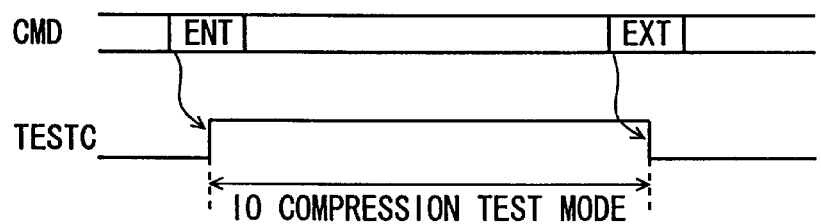
FIG. 11B shows a signal waveform representing the operation of the circuits shown in FIG. 11A.

FIG. 11B is a signal waveform diagram representing the operation of the test mode designating signal generating unit shown in FIG. 11A. As seen from FIG. 11B, when external command CMD is a command ENT designating the test mode, test mode detecting circuit 11 detects the command ENT and applies the detection signal to test mode setting circuit 12. Test mode setting circuit 12, according to the test mode detection signal from test mode detecting circuit 11, drives and keeps test mode designating signal TESTC to and at an active state. Data writing and reading are performed while test mode designating signal TESTC is in the active state. When test mode designating signal TESTC is activated, bit designating signals φx16 and φx8 for gate circuits 1 and 3 shown in FIG. 2 are driven to an inactive state, and gate circuits 1 and 3 are set to a nonconductive state.

When command CMD is a command EXT instructing a completion of the IO compression test, test mode detecting circuit 11 detects this test mode completion designation. According to the detection of the test mode completion, test mode setting circuit 12 drives test mode designating signal TESTC to an inactive state. Thus, the IO compression test mode is completed, and the semiconductor memory device operates according to a set DQ configuration.

In the case where data of memory cells selected by one column select line are externally set, what is required is only to generate one test mode control signal (it is unnecessary to set whether data are inverted or not). Thus, the test can be controlled with ease.

As explained above, according to the second embodiment of the present invention, the global IO line pairs to which memory cells selected by one column select line are connected, are configured such that adjacent global IO line pairs are coupled to different internal data line pairs. Data to be transmitted to the adjacent global IO line pairs (adjacent memory cells) can be set externally, and thus, reverse data can readily be written into adjacent memory cells.

Third Embodiment

Figure 12:
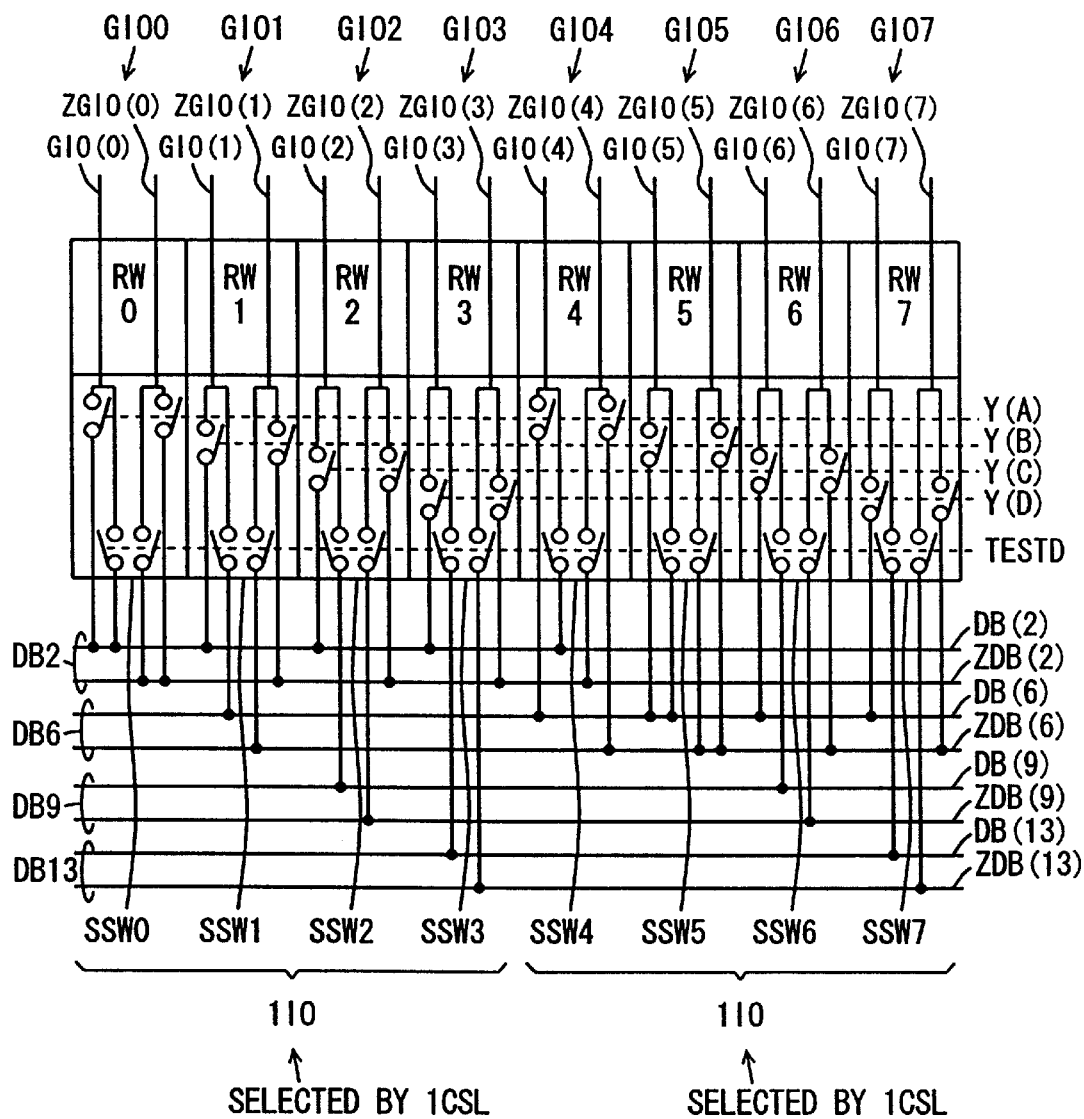
FIG. 12 is a diagram schematically showing a configuration of a main portion of a semiconductor memory device according to a third embodiment of the present invention.

FIG. 12 schematically shows a configuration of a main portion of the semiconductor memory device according to the third embodiment of the present invention. A configuration of a portion related to global IO line pairs of 8 bits, GIO0–GIO7, is shown in FIG. 12. The configuration of the memory array is the same as that shown in FIGS. 16 to 18. In the configuration shown in FIG. 12, memory cells selected by one column select line CSL in the IO compression test mode are coupled to internal data line pairs different from each other. More specifically, in the IO compression test mode, select circuits SSW0–SSW3 provided for write/ read amplifiers RW0–RW3 couple these wiite/read amplifiers RW0–RW3 to internal data aline pairs DB2, DB6, DB9 and DB13, respectively. In the IO compression test mode, select circuits SSW4–SSW7 also couple corresponding writelread amplifiers RW4–RW7 to internal data line pairs DB2, DB6, DB9 and DB13, respectively. Otherwise, the configuration shown in FIG. 12 is identical to that shown in FIG. 8, and thus, corresponding portions are denoted by the same reference characters, and detailed description thereof is not repeated.

Write/read amplifiers RW0–RW7 are provided corresponding to global IO line pairs GIO0–GIO7, respectively. Thus, in the IO compression test mode, the memory cells selected by one column select line CSL are coupled to different internal data line pairs DB2, DB6, DB9 and DB13 via the global IO line pairs. Internal data line pairs DB2, DB6, DB9 and DB13 are coupled to data terminals. Thus, data to be stored in a set of memory cells simultaneously selected by one column select line can be externally controlled, and data of an arbitrary pattern can be written therein. Accordingly, it is possible to readily perform a variety of tests (for interference between bit lines, etc.).

Figure 13:
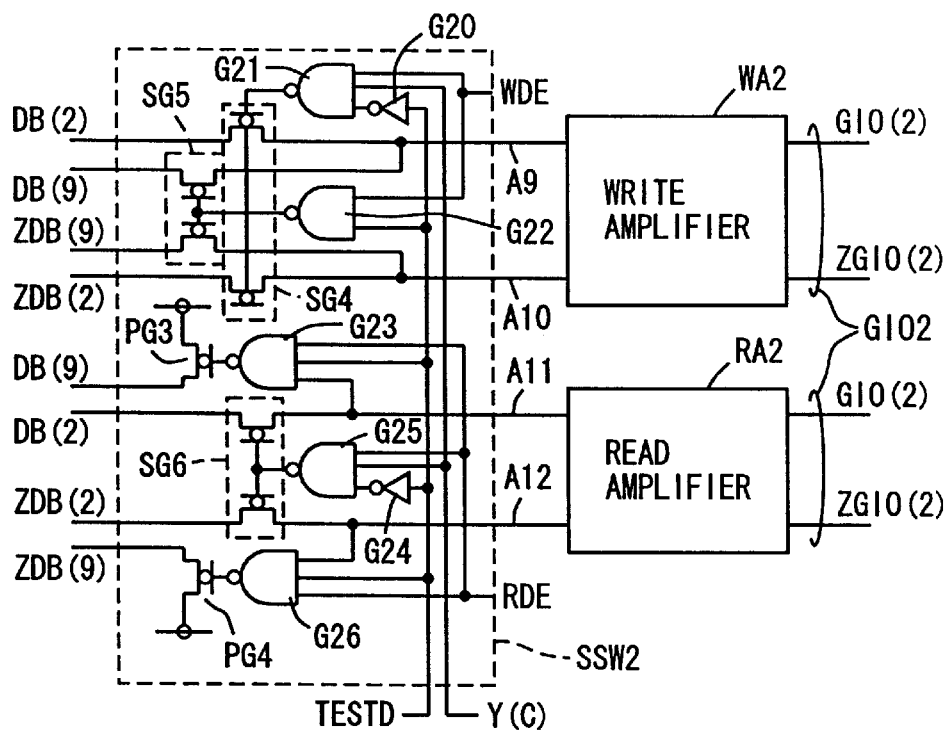
FIG. 13 is a diagram showing a configuration of the select circuit shown in FIG. 12.

FIG. 13 shows a configuration of select circuit SSW2 shown in FIG. 12. Select circuit SSW2 selectively couples write amplifier WA2 and read amplifier RA2 provided for global IO line pair GIO2, to internal data lines DB (2), ZDB (2) or to internal data lines DB (9), ZDB (9). The configuration of select circuit SSW2 is identical to that of select circuit SSW1 shown in FIG. 9A, except for a column select signal Y being applied and an internal data line pair being connected in the IO compression test mode. Thus, the corresponding portions are denoted by the same reference characters, and detailed description of the configuration will not be repeated.

In select circuit SSW2 shown in FIG. 13, in the IO compression test mode, select gate SG5 attains an on state, whereas select gate SG4 attains a nonconductive state. Internal data lines DB (9) and ZDB (9) are coupled to internal input nodes A9 and A10 of write amplifier WA2. At the time of reading in the IO compression test mode, either one of the internal data lines, DB (9) or ZDB (9), is driven to a power supply voltage level by drive transistor PG3 or PG4, according to the output signals of NAND gates G23 and G26. In a normal operation mode, these write amplifier WA2 and read amplifier RA2 are coupled to internal data lines DB (2) and ZDB (2) according to column select signal Y (C).

Other select circuits have the identical configurations, simply with different internal data lines connected thereto.

Figure 14:
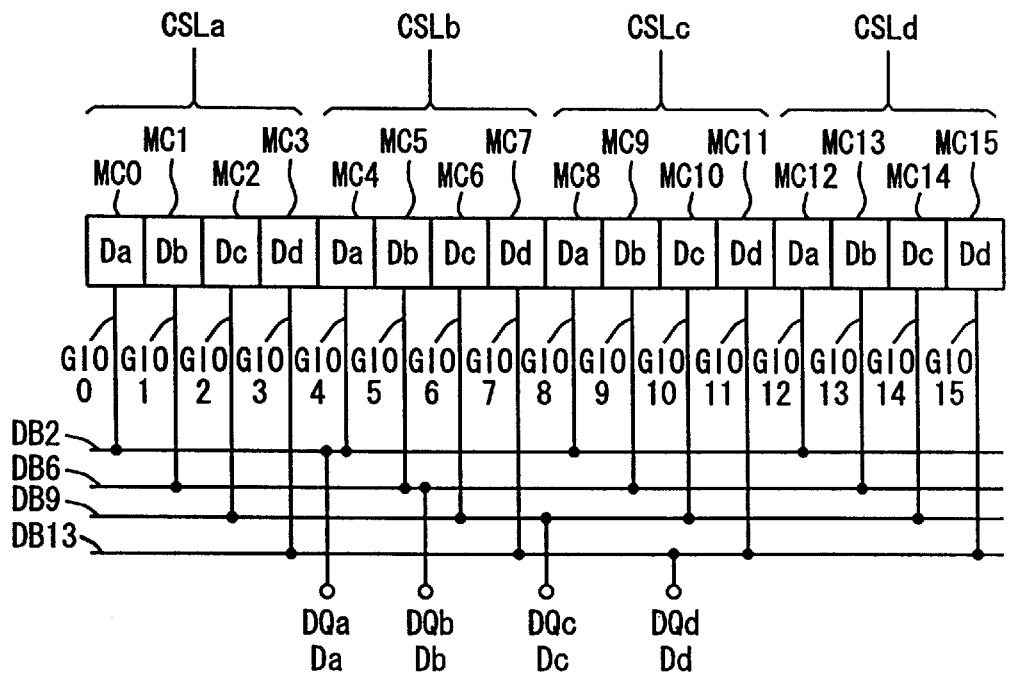
FIG. 14 is a diagram schematically showing connection between selected memory cells and internal data line pairs according to the third embodiment of the present invention.
Figure 15:
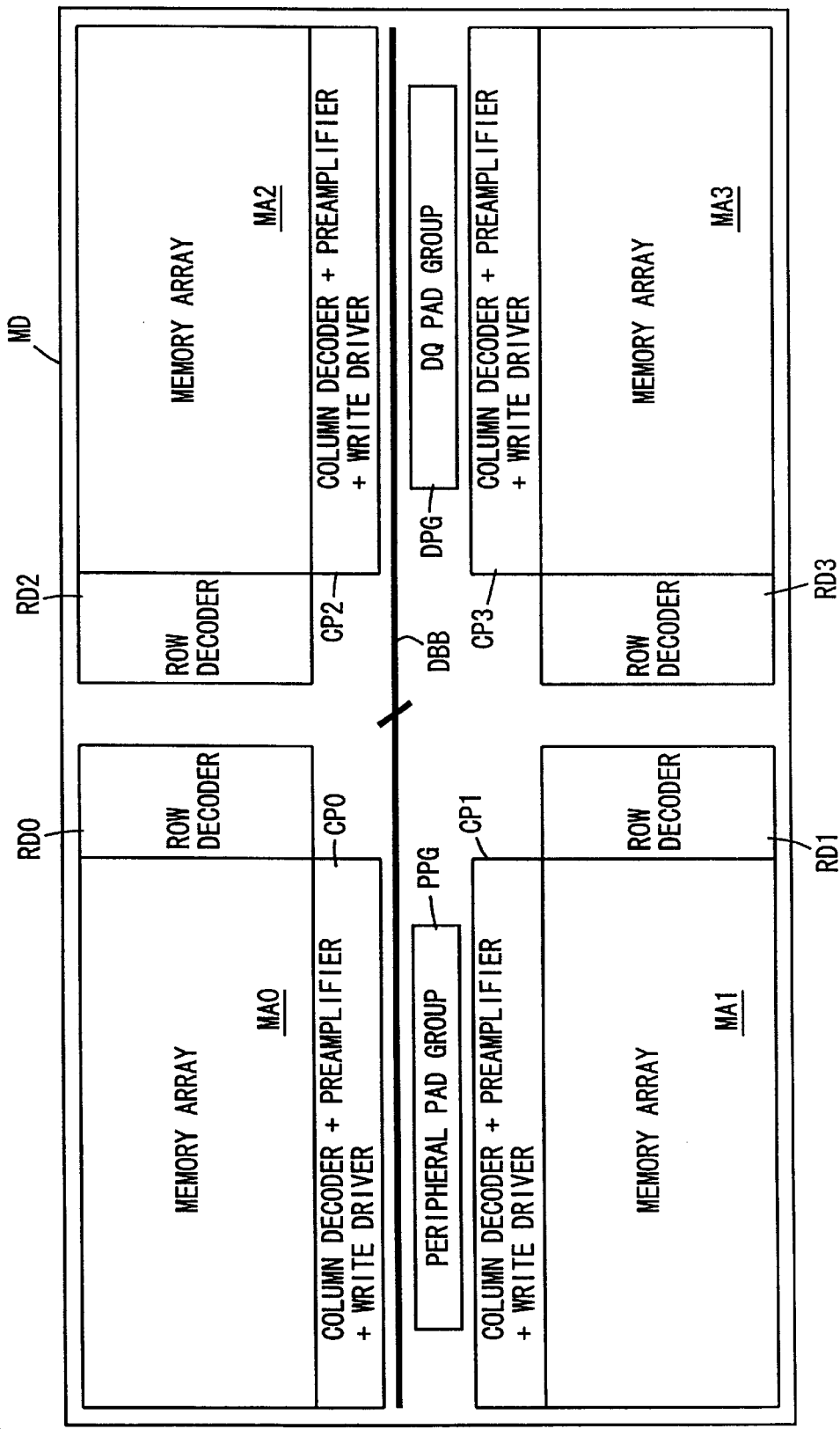
FIG. 15 is a diagram schematically showing an entire configuration of a conventional semiconductor memory device.

FIG. 14 schematically shows connection between selected memory cells and data terminals in the IO compression test mode according to the third embodiment of the present invention. Referring to FIG. 14, memory cells of 16 bits, MC0–MC15, are simultaneously selected by column select lines CSLa–CSLd. Memory cells MC0, MC4, MC8 and MC12 are coupled to internal data line pair DB2 via the respective global IO line pairs. Memory cells MC1, MC5, MC9 and MC13 are coupled to internal data line pair DB6 via the respective global IO line pairs. Memory cells MC2, MC6, MC10 and MC14 are coupled to internal data line pair DB9 via the respective global IO line pairs. Memory cells MC3, MC7, MC11 and MC15 are coupled to internal data line pair DB13 via the respective global IO line pairs.

Internal data line pairs DB2, DB6, DB9 and DB13 are coupled to data terminals DQa, DQb, DQc and DQd, respectively. Thus, by externally setting test data Da–Dd to be applied to these data terminals DQa–DQd, data of an arbitrary pattern can be written into the set of memory cells of 4 bits provided corresponding to each column select line. It is thus possible to write data of the arbitrary pattern into each set of memory cells, without switching data transmission paths.

Test mode designating signal TESTD can be generated using the configuration shown in FIG. 11A.

As explained above, according to the third embodiment of the present invention, memory cells in a set of memory cells selected by one column select line are coupled to different data terminals via internal data line pairs different from each other. Thus, test data of an arbitrary pattern can be written into each set of the memory cells, and therefore, a variety of tests can be performed even in an IO compression test mode.

Other Applications

In the description above, memory cells of 4 bits are selected by one column select line CSL, and memory cells of 16 bits are simultaneously selected from one memory array. However, the number of memory cells selected by one column select line is arbitrary, and the number of column select lines simultaneously selected (by activating column select signals) is also arbitrary. In addition, the number of bits of memory cell data simultaneously read out from the memory array is not limited to 16 bits. The present invention is applicable to any configuration in which a plurality of memory cells are selected by one column select line and data of the memory cells are compressed in an IO compression test mode.

The bit width of internal data bus is not limited to 16 bits, but may be wider.

Memory cell MC may be either a dynamic memory cell or a static memory cell.

Though data terminal DQ is provided with both write data and read data in the embodiments described above, data terminal DQ may have write data and read data provided via separate terminals (separated DQ configuration).

The internal data bus may be separated into a write data bus transmitting internal write data and a read data bus transmitting read data.

The test mode designating signal may be provided via a specific pad or a pin terminal that is unused at the time of testing.

A plurality of sets of memory cells may be selected simultaneously by one column select line- Further, a plurality of (e.g., two) word lines may be selected simultaneously, and a set of memory cells may be selected at the selected word lines by one column select line.

As explained above, according to the present invention, data of memory cells selected by one column select line can be externally set, so that test data of a variety of patterns can be written into the memory cells by external data in one test operation mode. Accordingly, it is possible to Adetect short circuits between adjacent global IO line pairs, between adjacent bit line pairs, and between adjacent memory cells, even in an IO compression test mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory array having a plurality of memory cells arranged in rows and columns;

column select circuitry for simultaneously selecting a plurality of sets of memory cells from said memory array according to a column address, each set including memory cells of plural bits;

a plurality of data terminals;

a plurality of internal data lines provided corresponding to said plurality of data terminals; and test switching circuitry for simultaneously coupling said plurality of sets of memory cells to the internal data lines in a test mode operation, said test switching circuitry including a circuit for differentiating an internal data line to which a memory cell of at least one bit is coupled, from an internal data line to which a remaining memory cell is coupled in each of the sets of memory cells.

2. The semiconductor memory device according to claim 1, wherein said column select circuitry includes a circuit for driving a column select line to a selected state according to said column address, and each of said plurality of sets of memory cells includes memory cells selected by a common column select line.

3. The semiconductor memory device according to claim 1, further comprising a plurality of data transmission lines provided corresponding to memory cells in said plurality of sets, respectively, said data transmission lines being divided into sets corresponding to the sets of memory cells, wherein said test switching circuitry couples adjacent data transmission lines in each of said sets of said plurality of data transmission lines to different internal data lines in said test mode operation.

4. The semiconductor memory device according to claim 1, wherein said test switching circuitry couples adjacent memory cells simultaneously selected in said memory array to different internal data lines in said test mode operation.

5. The semiconductor memory device according to claim 3, wherein adjacent data transmission lines in each of said sets of the data transmission lines perform data transfer with adjacent columns of memory cells in a corresponding set of memory cells.

6. The semiconductor memory device according to claim 1, wherein said test switching circuitry couples memory cells in each of the sets of memory cells to internal data lines different from each other.

7. The semiconductor memory device according to claim 3, wherein said test switching circuitry couples the data transmission lines in each of said sets of data transmission lines to data terminals different from each other.

8. The semiconductor memory device according to claim 1, wherein said column select circuitry simultaneously drives column select lines provided corresponding to the respective sets of the memory cells of plural bits to a selected state.

9. The semiconductor memory device according to claim 8, wherein the memory cells in each of the sets of memory cells are, in common, selected by a corresponding one of said column select lines.

10. The semiconductor memory device according to claim 1, wherein said plurality of sets of memory cells are coupled to the internal data lines in the test mode operation in a different manner from in a normal mode operation.

* * * * *